United States Patent
Ishikawa et al.

(10) Patent No.: US 11,040,416 B2
(45) Date of Patent: Jun. 22, 2021

(54) COPPER PASTE FOR JOINING, METHOD FOR MANUFACTURING JOINED BODY, AND METHOD FOR MANUFACTURING SEMICONDUCTOR DEVICE

(71) Applicant: HITACHI CHEMICAL COMPANY, LTD., Tokyo (JP)

(72) Inventors: Dai Ishikawa, Tokyo (JP); Yuki Kawana, Tokyo (JP); Chie Sugama, Tokyo (JP); Hideo Nakako, Tokyo (JP); Yoshinori Ejiri, Tokyo (JP); Kazuhiko Kurafuchi, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 373 days.

(21) Appl. No.: 15/757,896

(22) PCT Filed: Sep. 7, 2016

(86) PCT No.: PCT/JP2016/076333
§ 371 (c)(1),
(2) Date: Mar. 6, 2018

(87) PCT Pub. No.: WO2017/043541
PCT Pub. Date: Mar. 16, 2017

(65) Prior Publication Data
US 2020/0108471 A1   Apr. 9, 2020

(30) Foreign Application Priority Data

Sep. 7, 2015   (JP) ............................. JP2015-176070

(51) Int. Cl.
*B23K 35/30* (2006.01)
*B23K 35/02* (2006.01)
(Continued)

(52) U.S. Cl.
CPC .............. *B23K 35/302* (2013.01); *B22F 7/08* (2013.01); *B23K 35/025* (2013.01); *B22F 7/062* (2013.01); *H01L 24/27* (2013.01)

(58) Field of Classification Search
None
See application file for complete search history.

(56) References Cited

U.S. PATENT DOCUMENTS

2014/0329105 A1* 11/2014 Nagamoto ......... H01B 13/0026
                                                       428/560
2015/0221626 A1*  8/2015 Motowaki .............. H01L 24/49
                                                       257/712

FOREIGN PATENT DOCUMENTS

JP    4928639 B2    12/2011
JP    5006081 B2    8/2012
(Continued)

OTHER PUBLICATIONS

R. Khazaka, L. Mendizabal, and D. Henry, "Review on Joint Shear Strength of Nano-Silver Paste and Its Long-Term High Temperature Reliability", Journal of Electronic Materials, 2014 vol. 43, No. 7, p. 2459-p. 2466.

(Continued)

*Primary Examiner* — Xiaobei Wang
(74) *Attorney, Agent, or Firm* — Fitch, Even, Tabin & Flannery. LLP

(57) ABSTRACT

Provided is copper paste for joining including metal particles, and a dispersion medium. The metal particles include sub-micro copper particles having a volume-average particle size of 0.12 µm to 0.8 µm, and flake-shaped micro copper particles having a maximum particle size of 1 µm to 20 µm, and an aspect ratio of 4 or greater, and the amount of the micro copper particles contained, which are included in the metal particles and have a maximum particle size of 1 µm to (Continued)

20 μm and an aspect ratio of less than 2, is 50% by mass or less on the basis of a total amount of the flake-shaped micro copper particles.

8 Claims, 20 Drawing Sheets

(51) Int. Cl.
*B22F 7/08* (2006.01)
*H01L 23/00* (2006.01)
*B22F 7/06* (2006.01)

(56) References Cited

FOREIGN PATENT DOCUMENTS

| | | |
|---|---|---|
| JP | 2013-247060 A | 12/2013 |
| JP | 2015-082385 A | 4/2015 |
| TW | 201511036 A | 3/2015 |
| WO | 2008/062548 A1 | 5/2005 |
| WO | 2011/114747 A1 | 9/2011 |

OTHER PUBLICATIONS

Katsuhiro Ueda, Sumio Inafuku, Iwao Mori, "Obtainment of Sectional Area of Stearic Acid Molecule—Experimental Value and Calculated Value—", Chemistry & Education, 1992, vol. 40 No. 2, p. 114-p. 117.

* cited by examiner

COPPER PASTE FOR JOINING, METHOD FOR MANUFACTURING JOINED BODY, AND METHOD FOR MANUFACTURING SEMICONDUCTOR DEVICE

CROSS-REFERENCE TO RELATED APPLICATIONS

This application is a U.S. national phase application filed under 35 U.S.C. § 371 of International Application No. PCT/JP2016/076333, filed Sep. 7, 2016, which claims priority from Japanese Patent Application No. 2015-176070, filed Sep. 7, 2015, designating the United States, which are hereby incorporated herein by reference in their entirety.

TECHNICAL FIELD

The present invention relates to copper paste for joining, a method for manufacturing a joined body and a method for manufacturing a semiconductor device by using the copper paste for joining, a joined body, and a semiconductor device.

BACKGROUND ART

When manufacturing semiconductor devices, various joining materials are used to join a semiconductor element and a lead frame and the like (support member). When joining a power semiconductor, an LSI, and the like, which are operated at a high temperature of 150° C. or higher, among the semiconductor devices, high-melting-point lead solder is used as a joining material. In recent, an operation temperature rises up to approximately the melting point of the high-melting-point lead solder due to large capacity and space saving of a semiconductor element, and thus it is difficult to secure connection reliability. On the other hand, a joining material, which does not contain lead, is demanded in accordance with strengthening of RoHS regulations.

Joining of a semiconductor element by using a material other than lead solder has been examined. For example, Patent Literature 1 suggests a technology of forming a sintered silver layer by sintering silver nanoparticles at a low temperature. It is known that the sintered silver has high connection reliability with respect to a power cycle (Non Patent Literature 1).

A technology of forming a sintered copper layer by sintering copper particles as another material is also suggested. For example, Patent Literature 2 discloses paste for joining which includes a cupric oxide particles and a reducing agent as a joining material for joining a semiconductor element and an electrode. In addition, Patent Literature 3 discloses a joining material that includes copper nano particles, and copper micro particles, copper sub-micro particles, or both of the copper micro particles and the copper sub-micro particles.

CITATION LIST

Patent Literature

Patent Literature 1: Japanese Patent No. 4928639
Patent Literature 2: Japanese Patent No. 5006081
Patent Literature 3: Japanese Unexamined Patent Publication No. 2014-167145

Non Patent Literature

Non Patent Literature 1: R. Khazaka, L. Mendizabal, D. Henry: J. ElecTron. Mater, 43(7), 2014, 2459 to 2466

SUMMARY OF INVENTION

Technical Problem

A method described in Patent Literature 1, densification of the sintered silver layer is essential to obtain high connection reliability, and thus a thermal compression process accompanied with pressurization is necessary. In the case of performing the thermal compression process accompanied with pressurization, there is a problem such as deterioration of production efficiency, and deterioration of yield ratio. In addition, in the case of using the silver nano particles, there is a problem that the material cost significantly increases due to silver.

In a method described in Patent Literature 2, volume shrinkage when copper oxide is reduced into copper is avoided by the thermal compression process. However, the above-described problem exists in the thermal compression process.

In a method described in Patent Literature 3, sintering is performed without pressurization, but the method is not sufficient in practical use due to the following viewpoints. Specifically, it is necessary to modify a surface of copper nano particles with a protective agent to suppress oxidation and to improve dispersibility. However, the copper nano particles have a large specific surface area, and thus the amount of the surface protective agent blended tends to increase in a joining material including the copper nano particles as a main component. In addition, the amount of a dispersion medium blended tends to increase so as to secure dispersibility. Accordingly, in the joining material described in Patent Literature 3, a ratio of the surface protective agent or the dispersion medium is increased for supply stability in storage, coating, and the like. Accordingly, volume shrinkage in sintering is likely to increase, and densification after sintering is likely to decrease. As a result, it is difficult to secure the strength of a sintered body.

An object of the invention is to provide copper paste for joining capable of obtaining sufficient joining strength even in the case of performing joining without pressurization. Another object of the invention is to provide a method for manufacturing a joined body and a method for manufacturing a semiconductor device by using the copper paste for joining, a joined body, and a semiconductor device.

Solution to Problem

According to an aspect of the invention, there is provided copper paste for joining including: metal particles; and a dispersion medium. The metal particles include sub-micro copper particles having a volume-average particle size of 0.12 μm to 0.8 μm, and flake-shaped micro copper particles having a maximum particle size of 1 μm to 20 μm, and an aspect ratio of 4 or greater, and the amount of the micro copper particles contained, which are included in the metal particles and have a maximum particle size of 1 μm to 20 μm and an aspect ratio of less than 2, is 50% by mass or less on the basis of a total amount of the flake-shaped micro copper particles.

According to the copper paste for joining of the invention, even when performing joining without pressurization, it is possible to obtain sufficient joining strength. The reason why this effect is obtained is considered as follows. The specific sub-micro copper particles and the specific flake-shaped micro copper particles are contained, and the amount of the micro copper particles which are contained and have an aspect ratio of 2 or less is limited. According to this, the flake-shaped micro copper particles in the copper paste for joining are likely to be oriented in approximately parallel to a joining surface, and thus sufficient sinterability is obtained, and it is possible to sufficiently suppress volume shrinkage during sintering. As a result, securement of the strength of the sintered body and an improvement of a joining force with the joining surface are accomplished. In addition, since the above-described effect can be obtained due to the sub-micro copper particles and the micro copper particles, the copper paste for joining of the invention has an advantage capable of being more cheaply and more stably supplied in comparison to a joining material including expensive copper nano particles as a main component. According to this, for example, in the case of manufacturing a joined body such as a semiconductor device, it is possible to further enhance production stability.

In this specification, a "flake shape" includes a flat plate shape such as a plate shape and a squamous shape. In this specification, an "aspect ratio" represents "long side/thickness" of a particle.

The copper paste for joining of the invention may be used without pressurization. In this specification, "without pressurization" represents a state of receiving own weight of a member to be joined, or a pressure of 0.01 MPa or lower in addition to the own weight.

In the copper paste for joining of the invention, the amount of the sub-micro copper particles contained may be 20% by mass to 90% by mass on the basis of a sum of a mass of the sub-micro copper particles and a mass of the flake-shaped micro copper particles, and the amount of the flake-shaped micro copper particles contained may be 1% by mass to 90% by mass on the basis of a total mass of the metal particles. When the amount of the sub-micro copper particles contained and the amount of the flake-shaped micro copper particles contained are in the above-described range, it is easy to secure the joining strength of a joined body that is manufactured by sintering the copper paste for joining. In the case of using the copper paste for joining in joining of a semiconductor element, a semiconductor device tends to exhibit satisfactory die shear strength, and connection reliability.

In the copper paste for joining of the invention, the metal particles may include at least one kind of metal particles selected from the group consisting of nickel, silver, gold, palladium, and platinum. In a case where the copper paste for joining further include the metal particles, it is possible to obtain a sintered body in which a plurality of kinds of metals are solid-solved or dispersed, and thus mechanical characteristics of the sintered body such as a yield stress and fatigue strength are improved. As a result, connection reliability is likely to be improved.

According to another aspect of the invention, there is provided a method for manufacturing a joined body. The method includes a process of preparing a laminated body in which a first member, and the copper paste for joining and a second member, which are disposed on a side on which own weight of the first member acts, are laminated in this order, and sintering the copper paste for joining in a state of receiving the own weight of the first member, or the own weight of the first member and a pressure of 0.01 MPa or lower.

According to the method for manufacturing a joined body of the invention, the copper paste for joining is used, and thus it is possible to manufacture a joined body in which members are joined to each other at a sufficient joining force through joining without pressurization.

According to still another aspect of the invention, there is provided a method for manufacturing a semiconductor device. The method includes a process of preparing a laminated body in which a first member, and the copper paste for joining and a second member, which are disposed on a side on which own weight of the first member acts, are laminated in this order, and sintering the copper paste for joining in a state of receiving the own weight of the first member, or the own weight of the first member and a pressure of 0.01 MPa or lower. At least one of the first member and the second member is a semiconductor element.

According to the method for manufacturing a semiconductor device of the invention, the copper paste for joining is used, and thus it is possible to manufacture a semiconductor device excellent in die shear strength through joining without pressurization. In addition, the semiconductor device, which is manufactured by the method for manufacturing a semiconductor device of the invention, is excellent in connection reliability.

According to still another aspect of the invention, there is provided a joined body including: a first member; a second member; and a sintered body of the copper paste for joining that joins the first member and the second member. In the joined body of the invention, the first member and the second member are joined through the copper sintered body having a sufficient joining force. In addition, the joined body of the invention includes the copper sintered body excellent in thermal conductivity, and thus the joined body is excellent in heat dissipation of a member.

In the joined body, at least one of the first member and the second member may include at least one kind of metal selected from the group consisting of copper, nickel, silver, gold, and palladium on a surface that is in contact with the sintered body. In this case, it is possible to further enhance adhesiveness between at least one of the first member and the second member, and the sintered body.

According to still another aspect of the invention, there is provided a semiconductor device including a first member, a second member, and a sintered body of the copper paste for joining that joins the first member and the second member. At least one of the first member and the second member is a semiconductor element. Since the semiconductor device of the invention includes the copper sintered body that has a sufficient joining force, and high thermal conductivity and melting point, the semiconductor device has sufficient die shear strength, and is excellent in connection reliability and power cycle resistance.

Advantageous Effects of Invention

According to the invention, it is possible to provide copper paste for joining capable of obtaining sufficient joining strength even in the case of performing joining without pressurization. In addition, according to the invention, it is possible to provide a method for manufacturing a joined body and a method for manufacturing a semiconductor device by using the copper paste for joining, a joined body, and a semiconductor device.

DESCRIPTION OF EMBODIMENTS

Figure 1:
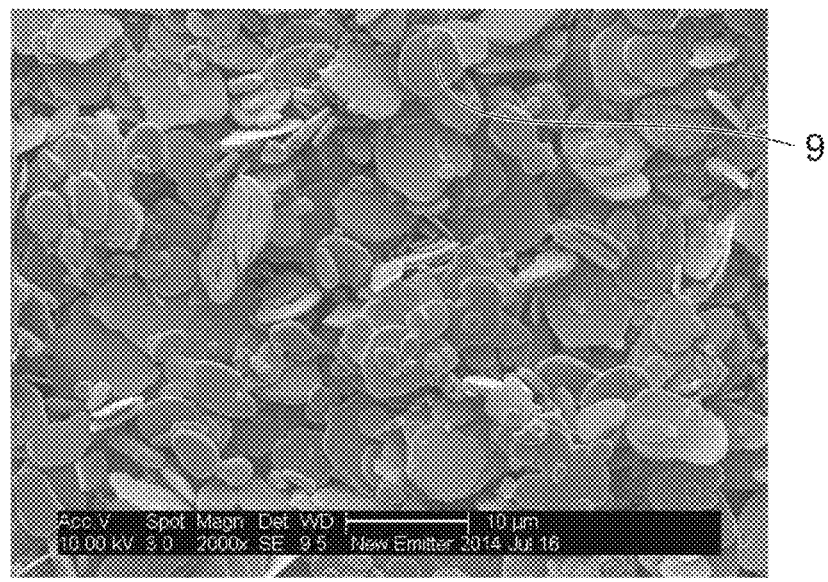
FIG. 1 is a SEM image illustrating flake-shaped micro copper particles MA-C025.

Hereinafter, a mode for carrying out the invention (hereinafter, referred to as "this embodiment") will be described in detail. The invention is not limited to the following embodiment.

<Copper Paste for Joining>

Copper paste for joining according to this embodiment is copper paste for joining that includes metal particles and a dispersion medium. The metal particles include sub-micro copper particles and flake-shaped micro copper particles.

(Metal Particles)

Examples of the metal particles according to this embodiment include the sub-micro copper particles, the flake-shaped micro copper particles, other metal particles other than copper particles, and the like.

(Sub-Micro Copper Particles)

Examples of the sub-micro copper particles include sub-micro copper particles including copper particles having a particle size of 0.12 μm to 0.8 μm. For example, copper particles having a volume-average particle size of 0.12 μm to 0.8 μm can be used. When the volume-average particle size of the sub-micro copper particles is 0.12 μm or greater, it is easy to obtain an effect such as suppression of the synthesizing cost of the sub-micro copper particles, satisfactory dispersibility, and suppression of the amount of surface treatment agent that is used. When the volume-average particle size of the sub-micro copper particles is 0.8 μm or less, it is easy to obtain an effect such as excellent sinterability of the sub-micro copper particles. From the viewpoint of further obtaining the effect, the volume-average particle size of the sub-micro copper particles may be 0.15 μm to 0.8 μm, 0.15 μm to 0.6 μm, 0.2 μm to 0.5 μm, or 0.3 μm to 0.45 μm.

Furthermore, the volume-average particle size in this specification represents 50% volume-average particle size. When obtaining the volume-average particle size of the copper particles, the volume-average particle size can be obtained by the following method. Specifically, copper particles which become a raw material, or dry copper particles obtained by removing a volatile component from the copper paste for joining are dispersed in a dispersion medium by using a dispersing agent, and the volume-average particle size of the resultant dispersed material is measured by using a light-scattering method particle size distribution measuring apparatus (for example, a shimadzu nano particle size distribution measuring apparatus (SALD-7500 nano, manufactured by Shimadzu Corporation), and the like. In the case of using the light-scattering method particle size distribution measuring apparatus, as the dispersion medium, hexane, toluene, α-terpineol, and the like can be used.

The sub-micro copper particles can include copper particles having a particle size of 0.12 μm to 0.8 μm in an amount of 10% by mass or greater. From the viewpoint of sinterability of the copper paste for joining, the sub-micro copper particles can include the copper particles having a particle size of 0.12 μm to 0.8 μm in an amount of 20% by mass or greater, 30% by mass or greater, or 100% by mass. When the content ratio of the copper particles having a particle size of 0.12 μm to 0.8 μm is 20% by mass or greater in the sub-micro copper particles, the dispersibility of the copper particles is further improved, and it is possible to further suppress an increase in viscosity and a decrease in paste concentration.

The particle size of the copper particles can be obtained by the following method. The particle size of the copper particles can be calculated, for example, from a SEM image. A powder of the copper particles is placed on a carbon tape for SEM by using a spatula, and is set as a sample for SEM. The sample for SEM is observed by a SEM apparatus at a magnification of 5000 times. A rectangle that is circumscribed to a copper particle on the SEM image is drawn by using image processing software, and one side of the rectangle is set as a particle size of the particle.

The amount of the sub-micro copper particles contained may be 20% by mass to 90% by mass on the basis of the total mass of metal particles, 30% by mass to 85% by mass, 35% by mass to 85% by mass, or 40% by mass to 80% by mass. The amount of the sub-micro copper particles contained is in the above-described range, it is easy to secure the joining strength of a joined body that is manufactured by sintering the copper paste for joining. In the case of using the copper paste for joining in joining of a semiconductor element, a semiconductor device tends to exhibit satisfactory die shear strength, and connection reliability.

The amount of the sub-micro copper particles contained is preferably 20% by mass to 90% by mass on the basis of the sum of the mass of the sub-micro copper particles and the mass of the flake-shaped micro copper particles. When the amount of the sub-micro copper particles contained is 20% by mass or greater, a space between the flake-shaped micro copper particles can be sufficiently filled with the sub-micro copper particles, and it is easy to secure the joining strength of a joined body that is manufactured by sintering the copper paste for joining. In the case of using the copper paste for joining in joining of a semiconductor element, a semiconductor device tends to exhibit satisfactory die shear strength and connection reliability. When the amount of the sub-micro copper particles contained is 90% by mass or less, it is possible to sufficiently suppress volume shrinkage when sintering the copper paste for joining, and thus it is easy to secure the joining strength of a joined body that is manufactured by sintering the copper paste for joining. In the case of using the copper paste for joining in joining of a semiconductor element, a semiconductor device tends to exhibit satisfactory die shear strength and connection reliability. From the viewpoint of further obtaining the effect, the amount of the sub-micro copper particles contained may be 30% by mass to 85% by mass, 35% by mass to 85% by mass, or 40% by mass to 80% by mass on the basis of the sum of the mass of the sub-micro copper particles and the mass of the flake-shaped micro copper particles.

A shape of the sub-micro copper particles is not particularly limited. Examples of the shape of the sub-micro copper particles include a spherical shape, a bulky shape, a needle shape, a flake shape, an approximately spherical shape, and an aggregate thereof. From the viewpoints of dispersibility and filling properties, the shape of the sub-micro copper particles may be the spherical shape, the approximately spherical shape, or the flake shape, and from the viewpoints of combustibility, dispersibility, mixability with flake-shaped micro particles, and the like, the shape of the sub-micro copper particles may be the spherical shape or the approximately spherical shape. In this specification, the "flake shape" includes a flat plate shape such as a plate shape and a squamous shape.

From the viewpoints of dispersibility, filling properties, and mixability with flake-shaped micro particles, an aspect ratio of the sub-micro copper particles may be 5 or less, or 3 or less. In this specification, the "aspect ratio" represents a ratio of a long side/thickness of particles. The long side and the thickness of particles can be measured and obtained, for example, from a SEM image of particles.

The sub-micro copper particles may be treated with a specific surface treatment agent. Examples of the specific surface treatment agent include an organic acid having 8 to 16 carbon atoms. Examples of the organic acid having 8 to 16 carbon atoms include saturated patty acids such as caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethyl nonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethyl undecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butyl undecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, methyl cyclohexane carboxylic acid, ethyl cyclohexane carboxylic acid, propyl cyclohexane carboxylic acid, butyl cyclohexane carboxylic acid, pentyl cyclohexane carboxylic acid, hexyl cyclohexane carboxylic acid, heptyl cyclohexane carboxylic acid, octyl cyclohexane carboxylic acid, and nonyl cyclohexane carboxylic acid; unsaturated patty acid such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, and sabic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used alone or in combination of two or more kinds thereof. When the organic acids and the sub-micro copper particles are combined, there is a tendency that dispersibility of the sub-micro copper particles and removal properties of the organic acids in sintering are compatible with each other.

A treatment amount of the surface treatment agent may an amount in which one molecular layer to three molecular layers adhere to a surface of the sub-micro copper particles. The amount can be calculated from the number of molecular layers (n) adhered to a surface of the sub-micro copper particles, a specific surface area ($A_p$) (unit: m$^2$/g) of the sub-micro copper particles, the molecular weight ($M_s$) (unit: g/mol) of the surface treatment agent, a minimum covering area ($S_S$) (unit: m$^2$/piece) of the surface treatment agent, and Avogadro's number ($N_A$) ($6.02 \times 10^{23}$). Specifically, the treatment amount of the surface treatment agent is calculated in accordance with the following expression.

The treatment amount of the surface treatment agent
(% by mass)=$\{(n \cdot A_p \cdot M_s)/(S_S \cdot N_A + n \cdot A_p \cdot M_s)\} \times 100\%$ The specific surface area of the sub-micro copper particles can be calculated by measuring the sub-micro copper particles which are dried with a BET specific surface area measurement method. In a case where the surface treatment agent is a straight-chain saturated patty acid, the minimum covering area of the surface treatment agent is $2.05 \times 10^{-19}$ m$^2$/one molecular. In the case of the other surface treatment agents, for example, the minimum covering area can be measured through calculation from a molecular model, or by a method described in "Chemical and Education" (UEDA KATSUHIRO, INAFUKU SUMIO, and MORI IWAO, 40(2), 1992, pages 114 to 117. An example of a quantitative method of the surface treatment agent will be described. The surface treatment agent can be identified by a thermal desorption gas and gas chromatography mass analyzer of a dry powder obtained by removing the dispersion medium from the copper paste for joining, and according to this, it is possible to determine the number of carbons and the molecular weight of the surface treatment agent. A carbon content ratio of the surface treatment agent can be analyzed through carbon content analysis. Examples of the carbon content analysis method include a high-frequency induction heating furnace combustion and infrared absorption method. The amount of the surface treatment agent can be calculated from the number of carbons, the molecular weight, and the carbon content ratio of the surface treatment agent that is identified in accordance with the above-described expression.

The treatment amount of the surface treatment agent may be 0.07% by mass to 2.1% by mass, 0.10% by mass to 1.6% by mass, or 0.2% by mass to 1.1% by mass.

Since the sub-micro copper particles have satisfactory sinterability, it is possible to reduce problems related to an expensive synthesizing cost, unsatisfactory dispersibility, and a decrease in volume shrinkage after sintering which are shown in a joining material that mainly uses copper nano particles.

As the sub-micro copper particles according to this embodiment, commercially available sub-micro copper particles can be used. Examples of the commercially available sub-micro copper particles include CH-0200 (manufactured by MITSUI MINING & SMELTING CO., LTD., volume-average particle size: 0.36 μm), HT-14 (manufactured by MITSUI MINING & SMELTING CO., LTD., volume-average particle size: 0.41 μm), CT-500 (manufactured by MITSUI MINING & SMELTING CO., LTD., volume-average particle size: 0.72 μm), and Tn-Cu100 (manufactured by TAIYO NIPPON SANSO CORPORATION, volume-average particle size: 0.12 μm).

(Flake-Shaped Micro Copper Particles)

Examples of the flake-shaped micro copper particles include micro copper particles including copper particles having a maximum particle size of 1 μm to 20 μm and an aspect ratio of 4 or greater are included. For example, copper particles having an average maximum particle size is 1μ to 20 μm and an aspect ratio of 4 or greater can be used. When an average maximum particle size and the aspect ratio of the flake-shaped micro copper particles are within the above-described range, it is possible to sufficiently reduce volume shrinkage when sintering the copper paste for joining, and it is easy to secure joining strength of a joined body that is manufactured by sintering the copper paste for joining Even in the case of using the copper paste for joining in joining of a semiconductor element, a semiconductor device tends to exhibit satisfactory die shear strength and connection reliability. From the viewpoint of further obtaining the above-described effect, the average maximum particle size of the flake-shaped micro copper particles may be 1 μm to 10 μm, or 3 μm to 10 μm. The maximum particle size and the average maximum particle size of the flake-shaped micro copper particles can be obtained, for example, from a SEM image of particles, and are obtained as a major axis X of the flake-shaped micro copper particles, and an average value Xav of the major axis to be described later.

The flake-shaped micro copper particles can include copper particles having a maximum particle size of 1 μm to 20 μm in an amount of 50% by mass or greater. From the viewpoints of orientation in a joined body, a reinforcing effect, and filling properties of joining paste, the flake-shaped micro copper particles can include copper particles having a maximum particle size of 1 μm to 20 μm in an amount of 70% by mass or greater, 80% by mass or greater, or 100% by mass. From the viewpoint of suppressing joining failure, for example, it is preferable that the flake-shaped micro copper particles do not include particles, which has a size greater than a joining thickness, such as particles having the maximum particle size greater than 20 μm.

In the flake-shaped micro copper particles, the aspect ratio may be 4 or greater, or 6 or greater. When the aspect ratio is within the above-described range, the flake-shaped micro copper particles in the copper paste for joining are oriented in approximately parallel to a joining surface, and thus it is possible to suppress volume shrinkage when sintering the copper paste for joining, and it is easy to secure joining strength of a joined body that is manufactured by sintering the copper paste for joining. In the case of using the copper paste for joining in joining of a semiconductor element, a semiconductor device tends to exhibit satisfactory die shear strength and connection reliability.

The amount of the flake-shaped micro copper particles contained may be 1% by mass to 90% by mass, 10% by mass to 70% by mass, or 20% by mass to 50% by mass on the basis of a total mass of metal particles. When the amount of the flake-shaped micro copper particles contained is within the above-described range, it is easy to secure joining strength of a joined body that is manufactured by sintering the copper paste for joining. In the case of using the copper paste for joining in joining of a semiconductor element, a semiconductor device tends to exhibit satisfactory die shear strength and connection reliability.

The sum of the amount of the sub-micro copper particles contained and the amount of flake-shaped micro copper particles contained may be 80% by mass or greater on the basis of the total mass of the metal particles. When the sum of the amount of the sub-micro copper particles contained and the amount of the micro copper particles contained is within the above-described range, it is possible to sufficiently reduce volume shrinkage when sintering the copper paste for joining, and it is easy to secure joining strength of a joined body that is manufactured by sintering the copper paste for joining. In the case of using the copper paste for joining in joining of a semiconductor element, a semiconductor device tends to exhibit satisfactory die shear strength and connection reliability. From the viewpoint of further obtaining the above-described effect, the sum of the amount of the sub-micro copper particles contained and the amount of the flake-shaped micro copper particles contained may be 90% by mass or greater, 95% by mass or greater, or 100% by mass on the basis of the total mass of the metal particles.

The shape of the flake-shaped micro copper particles according to this embodiment can be defined by parameters such as a major axis (maximum particle size) X, an intermediate size (width), and a minor axis (thickness) T. In a three-dimensional shape of the flake-shaped micro copper particles, the major axis X is a distance between two parallel planes selected among a plurality of pairs of parallel planes circumscribed to a flake-shaped micro copper particle so that the distance between the two parallel planes becomes the maximum. The intermediate size Y is a distance between two parallel planes which are perpendicular to the two parallel planes between which the major axis is obtained, and are selected among a plurality of pairs of parallel planes circumscribed to a flake-shaped micro copper particle so that the distance between the two parallel planes becomes the maximum. The minor axis T is a distance between two parallel planes which are perpendicular to the two parallel planes between which the major axis X is obtained and the two parallel planes between which the intermediate size Y is obtained, and are selected among a plurality of pairs of parallel planes circumscribed to the flake-shaped micro copper particle so that the distance between the two parallel planes becomes the maximum.

The average value Xav of the major axis may be 1 μm to 20.0 μm, 1 μm to 10 μm, or 3 μm to 10 μm. When Xav is within the above-described range, in a joined body that is manufactured by sintering the copper paste for joining, a sintered body of the copper paste for joining is likely to be formed in an appropriate thickness.

A ratio (aspect ratio) Xav/Tav of the average value Xav of the major axis to the average value Tav of the minor axis may be 4.0 or greater, 6.0 or greater, or 10.0 or greater. When Xav/Tav is within the above-described range, the flake-shaped micro copper particles in the copper paste for joining are likely to be oriented in approximately parallel to a joining surface, and thus it is possible to suppress volume shrinkage when sintering the copper paste for joining, and it is easy to secure joining strength of a joined body that is manufactured by sintering the copper paste for joining. In the case of using the copper paste for joining in joining of a semiconductor element, it is easy to improve die shear strength and connection reliability of a semiconductor device.

A ratio Xav/Yav of the average value Xav of the major axis to an average value of Yav of the intermediate size may be 2.0 or less, 1.7 or less, or 1.5 or less. When Xav/Yav is within the above-described range, flake-shaped particles, in which the shape of the flake-shaped micro copper particles has an area to a certain extent, are obtained, and the flake-shaped micro copper particles in the copper paste for joining are likely to be oriented in approximately parallel to a joining surface. Accordingly, it is possible to suppress volume shrinkage when sintering the copper paste for joining, and it is easy to secure joining strength of a joined body that is manufactured by sintering the copper paste for joining. In the case of using the copper paste for joining in joining of a semiconductor element, it is easy to improve die shear strength and connection reliability of a semiconductor device. When Xav/Yav is greater than 2.0, it can be seen that the shape of the flake-shaped micro copper particles is close to an elongated shape.

A ratio Yav/Tav of the average value Yav of the intermediate size to the average value Tav of the minor axis may be 2.5 or greater, 4.0 or greater, or 8.0 or greater. When Yav/Tav is within the above-described range, the flake-shaped micro copper particles in the copper paste for joining are likely to be oriented in approximately parallel to a joining surface. Accordingly, it is possible to suppress volume shrinkage when sintering the copper paste for joining, and it is easy to secure joining strength of a joined body that is manufactured by sintering the copper paste for joining. In the case of using the copper paste for joining in joining of a semiconductor element, it is easy to improve die shear strength and connection reliability of a semiconductor device.

A method of calculating the major axis X and the intermediate size Y of the flake-shaped micro copper particles from a SEM image will be exemplified. A powder of the flake-shaped micro copper particles is placed on a carbon tape for SEM by using a spatula, and is set as a sample for SEM. The sample for SEM is observed by a SEM apparatus at a magnification of 5000 times. FIG. 1 is a SEM image illustrating MA-C025 (manufactured by MITSUI MINING & SMELTING CO., LTD.) that is an example of the flake-shaped micro copper particles. A rectangle that is circumscribed to flake-shaped micro copper particle 9 on the SEM image is drawn by using image processing software. A long side of the rectangle is set as the major axis X of the particle, and a short side of the rectangle is set as the intermediate size Y of the particle. The measurement is performed with respect to 50 or greater flake-shaped micro copper particles by using a plurality of SEM images, and the average value Xav of the major axis, and the average value Yav of the intermediate size are calculated.

Figure 6:
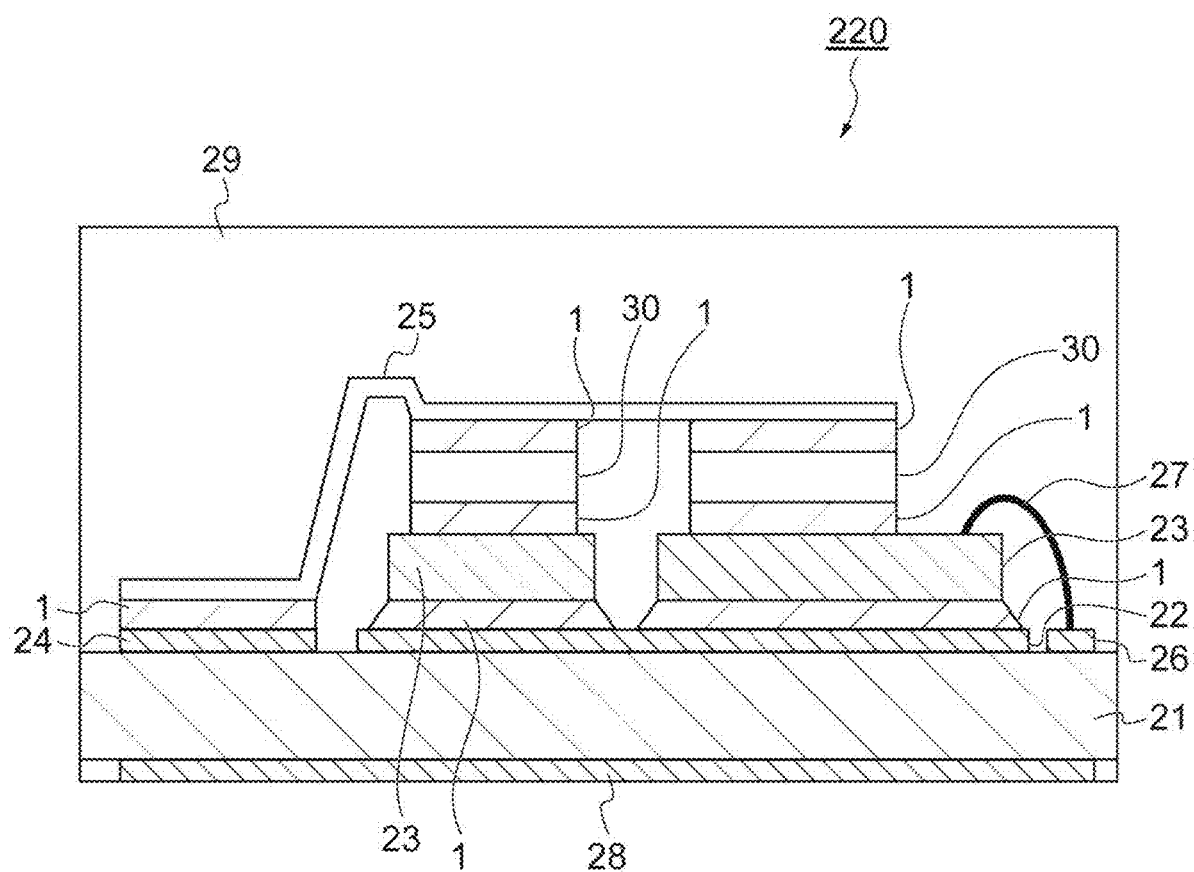
FIG. 6 is a schematic cross-sectional view illustrating an example of the semiconductor device that is manufactured by using the copper paste for joining according to this embodiment.

A method of calculating the minor axis T of the flake-shaped micro copper particles from a SEM image will be exemplified. Copper paste including the flake-shaped micro copper particles is printed on a copper substrate, and a silicon chip is mounted thereto. The laminated body is dried in the air by using a hot plate and the like under conditions of 100° C. and 30 minutes to prepare a joined object in which the copper plate and the silicon chip are weakly bonded by the dry copper paste for joining. The joined object is cured by an epoxy casting resin, and a cured sample is ground by abrasive paper to expose a cross-section in the vicinity of the center of the joined object. The cross-section is subjected to cross-section polisher (CP) processing by using an argon ion, and the resultant sample is set as a sample for SEM. The sample for SEM is observed with a SEM apparatus at a magnification of 5000 times. FIG. 6 is a SEM image of a dry film of the copper paste for joining when performing a drying treatment under conditions of 100° C. and 30 minutes in a state in which copper paste for joining in the following Example 6 is interposed between a chip and a substrate. With respect to a shape derived from a flake-shaped micro copper particle on the SEM image, a rectangle that is circumscribed to the flake-shaped micro copper particle is drawn by image processing software, and a short side of the rectangle is set as the minor axis T of the particle. The measurement is performed with respect to 50 or more flake-shaped micro copper particles by using a plurality of SEM images, and the average value Tav of the minor axis is calculated.

As the image processing software, for example, Microsoft Powerpoint (manufactured by Microsoft), and ImageJ (manufactured by National Institutes of Health) can be used without particular limitation.

With regard to the flake-shaped micro copper particles, there is no particular limitation as to whether or not to perform treatment with a surface treatment agent. From the viewpoints of dispersion stability and oxidation resistance, the flake-shaped micro copper particles may be treated with the surface treatment agent. The surface treatment agent may be removed during joining Example of the surface treatment agent include aliphatic carboxylic acids such as palmitic acid, stearic acid, arachidic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, tetraethylene glycol; aromatic alcohols such as p-phenyl phenol; alkylamines such as octylamine, dodecylamine, and stearylamine; alphatic nitriles such as stearonitrile and decanitrile; silane coupling agents such as alkylalkoxysilane; polymer treatment agents such as polyethylene glycol, polyvinyl alcohol, polyvinyl pyrrolidone, and silicone oligomer; and the like. The surface treatment agents may be used alone or in combination of two or more kinds thereof.

The treatment amount of the surface treatment agent may be set to an amount corresponding to one molecular layer or more on a particle surface. The treatment amount of the surface treatment agent varies due to a specific surface area of the flake-shaped micro copper particles, the molecular weight of the surface treatment agent, and a minimum covering area of the surface treatment agent. The treatment amount of the surface treatment agent is typically 0.001% by mass or greater. The specific surface area of the flake-shaped micro copper particles, the molecular weight of the surface treatment agent, and the minimum covering area of the surface treatment agent can be calculated by the above-described methods.

In the case of preparing the copper paste for joining with the sub-micro copper particles alone, volume shrinkage and sintering shrinkage along with drying of the dispersion medium are great, and thus the copper paste for joining is likely to be peeled off from a joining surface during sintering of the copper paste for joining, and thus it is difficult to obtain sufficient die shear strength and connection reliability in joining of a semiconductor element and the like. When the sub-micro copper particles and the flake-shaped micro copper particles are used in combination, volume shrinkage when sintering the copper paste for joining is suppressed, and thus a joined body can have sufficient joining strength. In the case of using the copper paste for joining in joining of a semiconductor element, a semiconductor device has an effect of exhibiting satisfactory die shear strength and connection reliability.

In the copper paste for joining of this embodiment, it is preferable that the amount of the micro copper particles, which are included in the metal particles, and have a maximum particle size of 1 µm to 20 µm and an aspect ratio of less than 2, is 50% by mass or less, and preferably 30% by mass or less on the basis of a total amount of the flake-shaped micro copper particles having the maximum particle size of 1 µm to 20 µm and an aspect ratio of 4 or greater. When the amount of the micro copper particles having the maximum particle size of 1 µm to 20 µm and the aspect ratio of less than 2 is limited, the flake-shaped micro copper particles in the copper paste for joining are likely to be oriented in approximately parallel to a joining surface, and thus it is possible to effectively suppress volume shrinkage when sintering the copper paste for joining According to this, it is easy to secure the joining strength of a joined body that is manufactured by sintering the copper paste for joining. In the case of using the copper paste for joining in joining of a semiconductor element, it is easy to improve die shear strength and connection reliability of a semiconductor device. From the viewpoint capable of further easily obtaining the effect, the amount of the micro copper particles having the maximum particle size of 1 µm to 20 µm and the aspect ratio of less than 2 may be 20% by mass or less, or 10% by mass on the basis of a total amount of the flake-shaped micro copper particles having the maximum particle size of 1 µm to 20 µm and the aspect ratio of 4 or greater.

As the flake-shaped micro copper particles according to this embodiment, commercially available flake-shaped micro copper particles can be used. Examples of the commercially available flake-shaped micro copper particles include MA-C025 (manufactured by MITSUI MINING & SMELTING CO., LTD., average maximum particle size: 4.1 µm), 3L3 (manufactured by FUKUDA METAL FOIL & POWDER CO., LTD., volume maximum particle size: 7.3 µm), 1110F (manufactured by MITSUI MINING & SMELTING CO., LTD., average maximum particle size: 5.8 µm), and 2L3 (manufactured by FUKUDA METAL FOIL & POWDER CO., LTD., average maximum diameter: 9 µm).

In the copper paste for joining of this embodiment, as the micro copper particles which are blended, micro copper particles, which include flake-shape micro copper particles having a maximum particle size of 1 µm to 20 µm and an aspect ratio of 4 or greater, and in which the amount of micro copper particles having a maximum particle size of 1 µm to 20 µm and an aspect ratio of less than 2 is 50% by mass or less, and preferably 30% by mass or less on the basis of a total amount of the flake-shaped micro copper particles, can be used. In the case of using the commercially available flake-shaped micro copper particles, flake-shaped micro copper particles, which include flake-shaped micro copper particles having a maximum particle size of 1 µm to 20 µm and an aspect ratio of 4 or greater, and in which the amount of micro copper particles having a maximum particle size of 1 µm to 20 µm and an aspect ratio of less than 2 is 50% by mass or less on the basis of the total amount of the flake-shaped micro copper particles, and preferably 30% by mass or less, may be selected.

(Other Metal Particles Other Than Copper Particles)

As the metal particles, other metal particles other than the sub-micro copper particles and the micro copper particles may be included. For example, particles of nickel, silver, gold, palladium, platinum, and the like may be included. The other metal particles may have a volume-average particle size of 0.01 µm to 10 µm, 0.01 µm to 5 µm, or 0.05 µm to 3 µm. In a case where the other metal particles are included, the amount of the metal particles contained may be less than 20% by mass, or 10% by mass or less on the basis of the total mass of the metal particles from the viewpoint of obtaining sufficient joining properties. The other metal particles may not be included. A shape of the other metal particles is not particularly limited.

When the other metal particles other than the copper particles are included, it is possible to obtain a sintered body in which a plurality of kinds of metals are solid-solved or dispersed, and thus mechanical characteristics such as a yield stress and fatigue strength of the sintered body are improved, and thus connection reliability is likely to be improved. In addition, the plurality of kinds of metal particles are added, a sintered body of the copper paste for joining can have sufficient joining strength with respect to a specific adherend. In the case of using the copper paste for joining in joining of a semiconductor element, die shear strength and connection reliability of a semiconductor device are likely to be improved.

(Dispersion Medium)

The dispersion medium is not particularly limited, and a volatile dispersion medium is also possible. Examples of the volatile dispersion medium include monohydric or polyhydric alcohols such as pentanol, hexanol, heptanol, octanol, decanol, ethylene glycol, diethylene glycol, propylene glycol, butylene glycol, α-terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amids such as N-methyl-2-pyrrolidone, N,N-dimethylacetamide, and N,N-dimethylformamide; aliphatic hydrocarbon such as cyclohexanone, octane, nonane, decane, and undecane; aromatic hydrocarbon such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan.

The amount of the dispersion medium contained may be 5 to 50 parts by mass when the total mass of the metal particles is set to 100 parts by mass. When the amount of the dispersion medium contained is within the above-described range, it is possible to adjust the copper paste for joining to have appropriate viscosity, and sintering of the copper paste for joining is less likely to be obstructed.

(Additive)

A wetting improving agent such as a non-ionic surfactant and a fluorine-based surfactant; a defoaming agent such as silicone oil; an ion trapping agent such as an inorganic ion exchanger; and the like may be appropriately added to the copper paste for joining as necessary.

As one aspect of the copper paste for joining of this embodiment, the following copper paste for joining can be exemplified. In the copper paste for joining, the metal particles include sub-micro copper particles having a volume-average particle size of 0.12 µm to 0.8 µm and preferably 0.15 µm to 0.8 µm, and flake-shaped micro copper particles having a maximum particle size of 1 µm to 20 µm, and an aspect ratio of 4 or greater, and the amount of the micro copper particles, which are included in the metal particles and have a maximum particle size of 1 µm to 20 µm and an aspect ratio of less than 2, is 50% by mass or less and preferably 30% by mass or less on the basis of a total amount of the flake-shaped micro copper particles.

As the copper paste for joining, copper paste for joining obtained by blending the following (1) and (2) can be exemplified. (1) Sub-micro copper particles having a volume-average particle size of 0.12 µm to 0.8 µm and preferably 0.15 µm to 0.8 µm. (2) Micro copper particles which include flake-shaped micro copper particles having an average maximum particle size of 1 µm to 20 µm and an aspect ratio of 4 or greater, and in which the amount of micro copper particles having an average maximum particle size of 1 µm to 20 µm and an aspect ratio of less than 2 is 50% by mass or less and preferably 30% by mass or less on the basis of a total amount of the flake-shaped micro copper particles.

In addition, as another aspect of the copper paste for joining of this embodiment, the following copper paste for joining can be exemplified. Specifically, the copper paste for joining includes metal particles and a dispersion medium. The metal particles include sub-micro copper particles having a maximum particle size of 0.12 µm to 0.8 µm and preferably 0.15 µm to 0.8 µm, and flake-shaped micro copper particles having a maximum particle size of 1 µm to 20 µm, and an aspect ratio of 4 or greater, and the amount of the micro copper particles, which are included in the metal particles and have a maximum particle size of 1 µm to 20 µm and an aspect ratio of less than 2, is 50% by mass or less and preferably 30% by mass or less on the basis of a total amount of the flake-shaped micro copper particles. The maximum particle size of particles is obtained by a method in which copper particles which become a raw material or dry copper particles obtained by removing a volatile component from the copper paste for joining are observed with a scanning electron microscope (SEM). The amount of sub-micro copper particles contained and the flake-shaped micro copper particles contained in this embodiment can be set to the same range as described above.

(Preparation of Copper Paste for Joining)

The copper paste for joining can be prepared by mixing the sub-micro copper particles, the flake-shaped micro copper particles, the other metal particles, and an arbitrary additive to the dispersion medium. After mixing of the respective components, a stirring process may be performed. In the copper paste for joining, a maximum particle size of a dispersed solution may be adjusted by a classification operation. At this time, the maximum particle size of the dispersed solution may be set to 20 µm or less, or 10 µm or less.

The copper paste for joining may be prepared as follows. Specifically, the sub-micro copper particles, the surface treatment agent, and the dispersion medium are mixed with each other in advance, and a dispersing treatment is performed to prepare a dispersed solution of the sub-micro copper particles. Then, the flake-shaped micro copper particles, the other metal particles, and an arbitrary additive are added to the dispersed solution. According to this procedure, dispersibility of the sub-micro copper particles is improved, and mixability with the flake-shaped micro copper particles is enhanced, and thus the performance of the copper paste for joining is further improved. The dispersed solution of the sub-micro copper particles may be subjected to a classification operation to remove an aggregate.

The stirring processing may be performed by using a stirrer. Examples of the stirrer include a rotation and revolution type stirrer, a Raikai mixer, a biaxial kneader, a three-roll mill, a planetary mixer, and a thin layer shear disperser.

For example, the classification operation can be performed by using filtration, spontaneous sedimentation, and centrifugal separation. Examples of a filter for filtration include a metal mesh, a metal filter, and a nylon mesh.

Examples of the dispersion process include a thin layer shear disperser, a bead mill, an ultrasonic homogenizer, a high shear mixer, a narrow gap three-roll mill, a wet type ultra-atomization apparatus, a supersonic jet mill, and an ultrahigh pressure homogenizer.

When being shaped, the copper paste for joining may be adjusted to viscosity appropriate for a printing and application method. As the viscosity of the copper paste for joining, for example, Casson viscosity at 25° C. may be 0.05 Pa·s to 2.0 Pa·s, or 0.06 Pa·s to 1.0 Pa·s.

When the copper paste for joining of this embodiment is provided on a member or between members by a method such as application, the flake-shaped micro copper particles are likely to be oriented in approximately parallel to an interface with the members (interface between a paste layer and the members). At this time, as to whether the flake-shaped micro copper particles is parallel to the interface to a certain extent can be expressed by the degree of orientation order S. The degree of orientation order S can be calculated by Expression (1).

$$S = \tfrac{1}{2} \times (3 \langle \cos^2 \theta \rangle - 1) \qquad (1)$$

In Expression, $\theta$ represents an angle made by the interface and the flake-shaped micro copper particles, and $\langle \cos^2 \theta \rangle$ represents an average value of a plurality of values of $\cos^2 \theta$.

The degree of orientation order S may be 0.88 to 1.00. When the degree of orientation order S is within this range, the flake-shaped micro copper particles in the copper paste for joining are oriented in approximately parallel to a joining surface. Accordingly, it is possible to suppress volume shrinkage when sintering the copper paste for joining, and it is easy to secure joining strength of a joined body that is manufactured by sintering the copper paste for joining. In the case of using the copper paste for joining in joining of a semiconductor element, it is easy to improve die shear strength and connection reliability of a semiconductor device.

The degree of orientation order S can be obtained, for example, from a SEM image of a dry body of the copper paste for joining A method of calculating the degree of orientation order S from the SEM image will be exemplified below. The copper paste for joining is printed on a copper substrate, and a silicon chip is mounted on the copper paste for joining. The laminated body is sintered in the air by using a hot plate and the like under conditions of 100° C. and 30 minutes to prepare a bonded object in which the copper plate and the silicon chip are weakly bonded by the dry copper paste for joining. An epoxy casting resin is poured to bury the entirety of the bonded object, and then the epoxy casting resin is cured. The casted bonded object is cut in the vicinity of a cross-section to be observed, and the cross-section is ground through polishing and is subjected to CP processing. The resultant object is set as a sample. The cross-section of the sample is observed with a SEM apparatus at a magnification of 5000 times. With respect to a cross-sectional image that is obtained, an angle made by a major axis of a shape derived from a flake-shaped micro copper particle and an interface is measured by using image processing software having an angle measurement function. θ is measured in a shape derived from 50 or greater flake-shaped micro copper particles which are arbitrarily selected, θ is substituted for Expression (1) to calculate the degree of orientation order S. As the image processing software, for example, ImageJ (manufactured by National Institutes of Health) can be used without particular limitation. The degree of orientation order S has a value of 0 to 1. The degree of orientation order S becomes 1 in a completely oriented state, and becomes 0 in a completely random state.

According to the copper paste for joining of this embodiment, the sub-micro copper particles and the flake-shaped micro copper particles are used in combination and the amount of specific micro copper particles contained is limited, and thus it is possible to obtain satisfactory sinterability, and it is possible to suppress volume shrinkage during sintering. According to this, the copper paste for joining of this embodiment can secure a joining force with a member without excessive pressurization, and a joined body that is manufactured by sintering the copper paste for joining can have sufficient joining strength. In the case of using the copper paste for joining in joining of a semiconductor element, a semiconductor device exhibits satisfactory die shear strength and connection reliability. That is, the copper paste for joining of this embodiment can be used as a joining material for joining without pressurization. In addition, according to the copper paste for joining of this embodiment, relatively cheaper copper particles are used, and thus it is possible to suppress the manufacturing cost, and mass production is possible. Particularly, in the copper paste for joining of this embodiment, the above-described effect can be obtained due to the sub-micro copper particles and the micro copper particles, and thus the copper paste for joining has an advantage capable of being more cheaply and more stably supplied in comparison to a joining material including expensive copper nano particles as a main component. According to this, for example, in the case of manufacturing a joined body such as a semiconductor device, it is possible to further enhance production stability.

<Joined Body and Semiconductor Device>

Hereinafter, a preferred embodiment will be described in detail with reference to the accompanying drawings. Furthermore, in the drawings, the same reference numeral will be given to the same or equivalent portions, and redundant description thereof will be omitted. In addition, dimension ratios in the drawing are not limited to ratios illustrated in the drawings.

Figure 2:
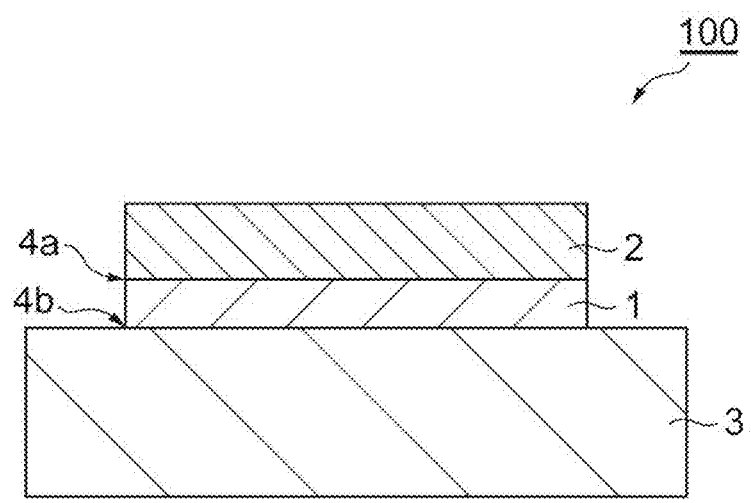
FIG. 2 is a schematic cross-sectional view illustrating an example of a joined body that is manufactured by using copper paste for joining according to this embodiment.

FIG. 2 is a schematic cross-sectional view illustrating an example of a joined body that is manufactured by using the copper paste for joining of this embodiment. A joined body 100 of this embodiment includes a first member 2, a second member 3, and a sintered body 1 of the copper paste for joining which joins the first member and the second member.

Examples of the first member 2 and the second member 3 include semiconductor elements such as an IGBT, a diode, a Schottky barrier diode, a MOS-FET, a thyristor, a logic, a sensor, an analog integrated circuit, an LED, a semiconductor laser, and a transmitter, a base material for semiconductor element mounting such as a lead frame, a metal plate-attached ceramic substrate (for example, DBC), and an LED package, a metal interconnection such as a copper ribbon and a metal frame, a block body such as a metal block, a power supply member such as a terminal, a heat dissipation plate, a water cooling plate, and the like.

The first member 2 and the second member 3 may include a metal on surfaces 4a and 4b which are in contact with a sintered body of the copper paste for joining Examples of the metal include copper, nickel, silver, gold, palladium, platinum, lead, tin, cobalt, and the like. The metals may be used alone or in combination of two or more kinds thereof. In addition, the surfaces which are in contact with the sintered body may an alloy including the metals. Examples of metals which can be used in the alloy include zinc, manganese, aluminum, beryllium, titanium, chromium, iron, molybdenum, and the like in addition to the above-described metals. Examples of a member including a metal on a surface that is in contact with the sintered body include a member including various kinds of metal plating, a wire, a chip including metal plating, a heat spreader, a metal plate-attached ceramic substrate, a lead frame including various kinds of metal plating or a lead frame constituted by various kinds of metals, a copper plate, and copper foil. In addition, in a case where the second member 3 is a semiconductor element, the first member 2 may be a metal interconnection such as a metal frame, a block body such as a metal block having thermal conductivity and electric conductivity, and the like.

The die shear strength of the joined body may be 10 MPa or greater, 15 MPa or greater, 20 MPa or greater, or 30 MPa or greater from the viewpoint of sufficiently joining the first member and the second member to each other. The die shear strength can be measured by using a full-universal type bond tester (4000 series, manufactured by DAGE corporation), and the like.

A thermal conductivity of a sintered body of the copper paste for joining may be 100 W/(m·k) or greater, 120 W/(m·k) or greater, or 150 W/(m·k) or greater from the viewpoints of heat dissipation and connection reliability at a high temperature. The thermal conductivity can be calculated from thermal diffusivity, specific heat capacity, and a density of the sintered body of the copper paste for joining.

The degree of orientation order S of the flake-shaped micro copper particles in a joined body may be set to 0.88 to 1.00. The degree of orientation order S in the joined body can be calculated by the above-described method in a state in which the joined body is set as an analysis target instead of the bonded object that is weakly bonded by the dry copper paste for joining.

Hereinafter, description will be given of a method for manufacturing a joined body that uses the copper paste for joining of this embodiment.

The method for manufacturing the joined body that uses the copper paste for joining of this embodiment includes a process of preparing a laminated body in which a first member, and the copper paste for joining and a second member, which are disposed on a side on which own weight of the first member acts, are laminated in this order, and sintering the copper paste for joining in a state of receiving the own weight of the first member, or the own weight of the first member and a pressure of 0.01 MPa or lower.

For example, the laminated body can be prepared by providing the copper paste for joining of this embodiment at a necessary portion of the second member and by disposing the first member on the copper paste for joining.

A method for providing the copper paste for joining of this embodiment at the necessary portion of the second member may be a method in which the copper paste for joining is deposited. As the method, for example, screen printing, transfer printing, offset printing, a jet printing method, a dispenser, a jet dispenser, a needle dispenser, a comma coater, a slit coater, a die coater, a gravure coater, slit coat, relief printing, intaglio printing, gravure printing, stencil printing, soft lithography, bar coat, an applicator, a particle deposition method, a spray coater, a spin coater, a dipping coater, electrodeposition coating, and the like can be used. The thickness of the copper paste for joining may 1 μm to 1000 μm, 10 μm to 500 μm, 50 μm to 200 μm, 10 μm to 3000 μm, 15 μm to 500 μm, 20 μm to 300 μm, 5 μm to 500 μm, 10 μm to 250 μm, or 15 μm 150 μm.

The copper paste for joining that is provided on the second member may be appropriately dried from the viewpoint of suppressing occurrence of flowing and voids during sintering. A gas atmosphere during drying may be set to the atmosphere, an oxygen-free atmosphere such as nitrogen and an inert gas, or a reducing atmosphere such as hydrogen and formic acid. A drying method may be drying through being left at room temperature, drying under heating, drying under a reduced pressure. In the drying under heating or the drying under a reduced pressure, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, a hot-plate press apparatus, and the like can be used. A drying temperature and a drying time may be appropriately adjusted in accordance with the kind and the amount of the dispersion medium that is used. With regard to the drying temperature and the drying time, for example, drying may be performed at a temperature of 50° C. to 180° C. for 1 minute to 120 minutes.

With regard to a method for disposing the first member on the copper paste for joining, for example, a chip mounter, a flip chip bonder, a positioning jig formed from carbon or ceramic can be exemplified.

The laminated body is heated to sinter the copper paste for joining With regard to the heating treatment, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, and the like can be used.

A gas atmosphere during sintering may be an oxygen-free atmosphere from the viewpoint of suppressing oxidation of the sintered body, the first member, the second member. The gas atmosphere during sintering may be a reducing atmosphere from the viewpoint of removing a surface oxide of copper particles of the copper paste for joining With regard to the oxygen-free atmosphere, introduction of an oxygen-free gas such as nitrogen and an inert gas, or a vacuum state can be exemplified. Examples of the reducing atmosphere include atmospheres in a pure hydrogen gas, in a mixed gas of hydrogen and nitrogen which are represented by a foaming gas, in nitrogen including a formic acid gas, in a mixed gas of hydrogen and an inert gas, in an inert gas including a formic acid gas, and the like.

The highest temperature reached in the heating treatment may 250° C. to 450° C., 250° C. to 400° C., or 250° C. to 350° C. from the viewpoints of reducing thermal damage to the first member and the second member and of improving a yield ratio. When the highest temperature reached is 200° C. or higher, if a retention time of the highest temperature reached is 60 minutes or shorter, sintering tends to be sufficiently progressed.

The retention time of the highest temperature reached may be 1 minute to 60 minutes, equal to or longer than 1 minute and shorter than 40 minutes, or equal to or longer than 1 minute and shorter than 30 minutes from the viewpoints of vaporizing the entirety of the dispersion medium and of improving a yield ratio.

When using the copper paste for joining of this embodiment, even in the case of performing joining without pressurization when sintering the laminated body, the joined body can have sufficient joining strength. That is, it is possible to obtain sufficient joining strength in a state of receiving the own weight of the first member laminated on the copper paste for joining, or in a state of receiving the own weight of the first member and a pressure of 0.01 MPa or less, and preferably 0.005 MPa or less. When the pressure received during sintering is within the above-described range, a particular pressurizing apparatus is not necessary. Accordingly, a yield ratio does not deteriorate, and it is possible to further reduce voids and it is possible to further improve die shear strength and connection reliability. As a method in which the copper paste for joining receives a pressure of 0.01 MPa or less, for example, a method in which a weight is placed on the first member can be exemplified.

In the joined body, at least one of the first member and the second member may be a semiconductor element. Examples of the semiconductor element include power modules including a diode, a rectifier, a thyristor, a MOS gate driver, a power switch, a power MOSFET, an IGBT, a Schottky diode, a fast recovery diode, and the like, a transmitter, an amplifier, an LED module, and the like. In this case, the joined body becomes a semiconductor device. The semiconductor device obtained can have sufficient die shear strength and connection reliability.

Figure 3:
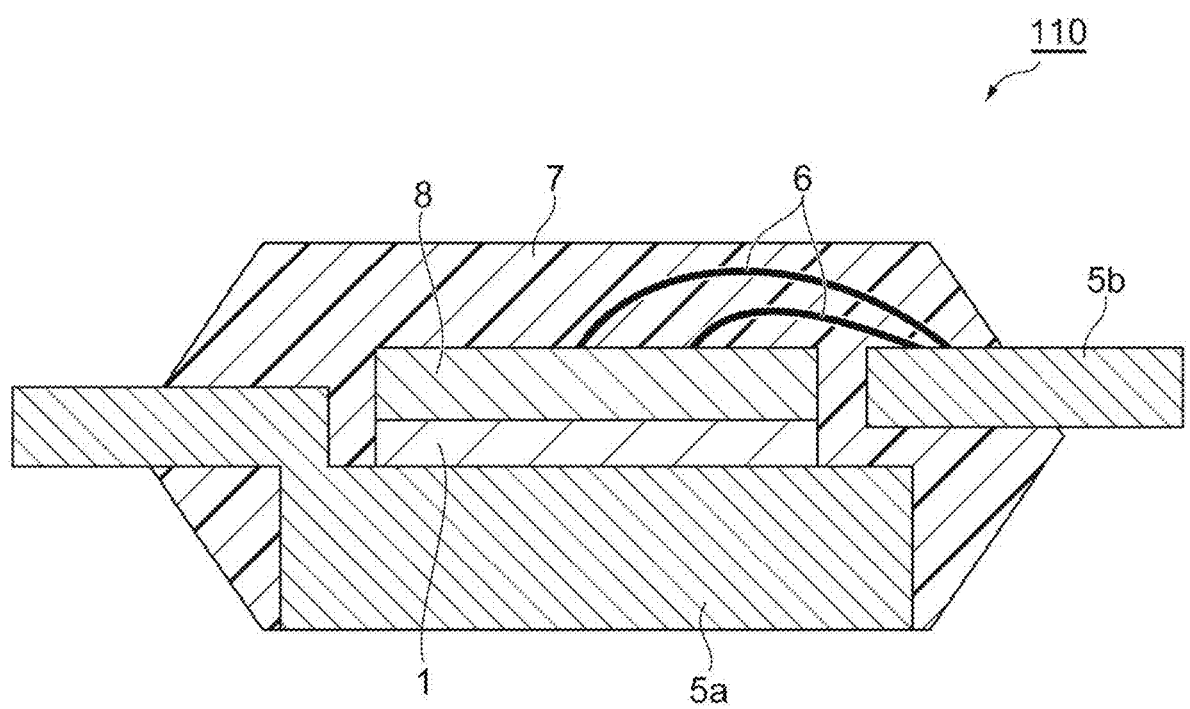
FIG. 3 is a schematic cross-sectional view illustrating an example of a semiconductor device that is manufactured by using the copper paste for joining according to this embodiment.

FIG. 3 is a schematic cross-sectional view illustrating an example of a semiconductor device that is manufactured by using the copper paste for joining of this embodiment. A semiconductor device 110 illustrated in FIG. 3 includes a semiconductor element 8 that is connected onto a lead frame 5a through the sintered body 1 of the copper paste for joining according to this embodiment, and a mold resin 7 that molds the resultant laminated body. The semiconductor element 8 is connected to a lead frame 5b through a wire 6.

Examples of a semiconductor device that is manufactured by using the copper paste for joining of this embodiment include power modules including a diode, a rectifier, a thyristor, a MOS gate driver, a power switch, a power MOSFET, an IGBT, a Schottky diode, a fast recovery diode and the like, a transmitter, an amplifier, a high-brightness LED module, a sensor, and the like.

The semiconductor device can be manufactured in the same manner as in the method for manufacturing the joined body described above. That is, the method for manufacturing the semiconductor device includes a process of preparing a laminated body in which a semiconductor element is used as at least one of the first member and the second member, and the first member, and the copper paste for joining and the second member, which are disposed on a side on which the own weight of the first member acts, are laminated in this order, and of sintering the copper paste for joining in a state of receiving the own weight of the first member, or the own weight of the first member and a pressure of 0.01 MPa or lower. For example, a process of providing the copper paste for joining on the lead frame 5a, disposing the semiconductor element 8 thereon, and heating the resultant laminated body can be exemplified. A semiconductor device that is obtained can have sufficient die shear strength and connection reliability even in the case of performing joining without pressurization. The semiconductor device of this embodiment includes a copper sintered body having a sufficient joining force and high thermal conductivity and melting point, and thus the semiconductor device has sufficient die shear strength, and is excellent in connection reliability and power cycle resistance.

According to the method, in a case where the second member is a semiconductor element, it is possible to reduce damage to the semiconductor element when joining a metal interconnection, a block body, and the like as the first member to the semiconductor element. A semiconductor device in which a member such as the metal interconnection, the block body, or the like is joined onto the semiconductor element will be described below.

As an embodiment of the semiconductor device, the following semiconductor device can be exemplified. Specifically, the semiconductor device includes a first electrode, a semiconductor element that is electrically connected to the first electrode, and a second electrode that is electrically connected to the semiconductor element through a metal interconnection. A sintered body of the copper paste for joining is provided between the semiconductor element and the metal interconnection, and between the metal interconnection and the second electrode.

Figure 4:
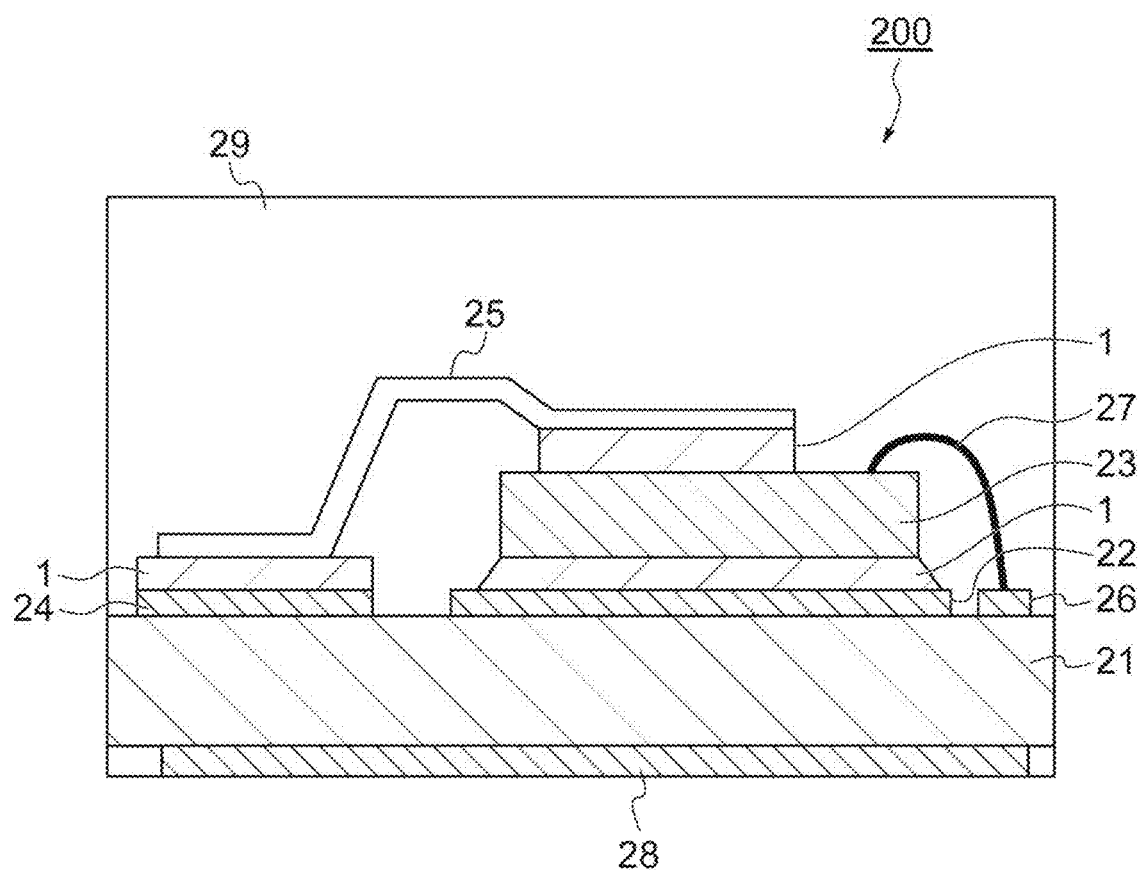
FIG. 4 is a schematic cross-sectional view illustrating an example of the semiconductor device that is manufactured by using the copper paste for joining according to this embodiment.

FIG. 4 is a schematic cross-sectional view illustrating an example of the semiconductor device. A semiconductor device 200 illustrated in FIG. 4 includes an insulating substrate 21 provided with a first electrode 22 and a second electrode 24, a semiconductor element 23 that is joined onto the first electrode 22 by the sintered body 1 of the copper paste for joining, and a metal interconnection 25 that electrically connects the semiconductor element 23 and the second electrode 24. Between the metal interconnection 25 and the semiconductor element 23, and between the metal interconnection 25 and the second electrode 24 are respectively joined to each other by the sintered body 1 of the copper paste for joining. In addition, the semiconductor element 23 is connected to a third electrode 26 through a wire 27. The semiconductor device 200 is provided with a copper plate 28 on a side, which is opposite to a surface on which the electrodes and the like are mounted, of the insulating substrate 21. In the semiconductor device 200, the structure body is sealed with an insulator 29. The semiconductor device 200 includes one piece of the semiconductor element 23 on the first electrode 22, but two or more pieces of the semiconductor elements 23 may be provided. In this case, a plurality of the semiconductor elements 23 can be respectively joined to the metal interconnection 25 by the sintered body 1 of the copper paste for joining.

Figure 5:
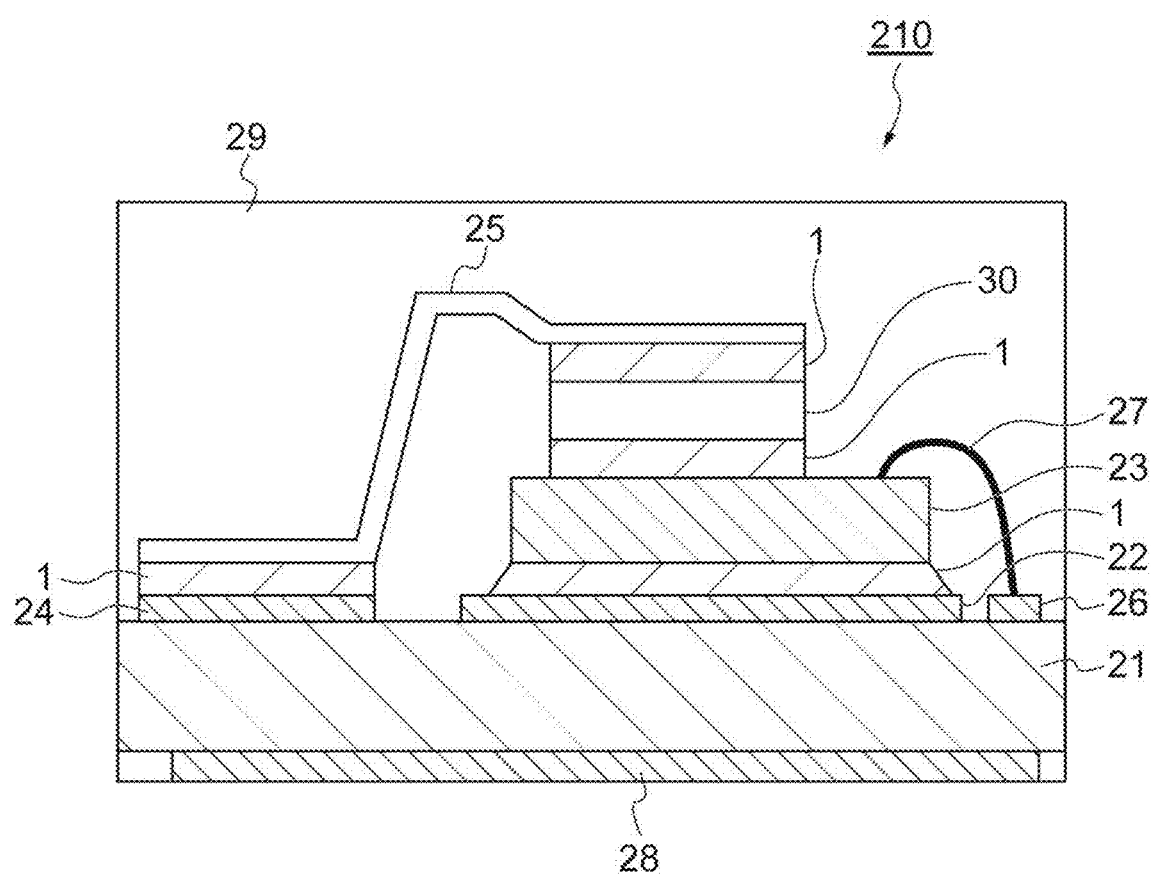
FIG. 5 is a schematic cross-sectional view illustrating an example of the semiconductor device that is manufactured by using the copper paste for joining according to this embodiment.

FIG. 5 is a schematic cross-sectional view illustrating another example of the semiconductor device. A semiconductor device 210 illustrated in FIG. 5 has the same configuration as in the semiconductor device 200 illustrated in FIG. 4 except that a block body 30 is provided between the semiconductor element 23 and the metal interconnection 25, and between the semiconductor element 23 and the block body 30, and between the block body 30 and the metal interconnection 25 are respectively joined by the sintered body 1 of the copper paste for joining. Furthermore, a position of the block body 30 can be appropriately changed, and may be provided between the first electrode 22 and the semiconductor element 23 as an example.

FIG. 6 is a schematic cross-sectional view illustrating still another example of the semiconductor device. A semiconductor device 220 illustrated in FIG. 6 has the same configuration as in the semiconductor device 210 illustrated in FIG. 5 except that the sintered body 1 of the copper paste for joining, which is parallel to the semiconductor element 23 and the block body 30, is further provided over the first electrode 22 to respectively join the first electrode 22, the semiconductor element 23, and the block body 30. The semiconductor device 220 includes two pieces of the semiconductor elements on the first electrode 22, but three or more pieces of the semiconductor elements may be provided. Even in this case, the three or more semiconductor elements 23 can be respectively joined to the metal interconnection 25 by the sintered body 1 of the copper paste for joining through the block body 30. Furthermore, a position of the block body 30 can be appropriately changed, and may be provided between the first electrode 22 and the semiconductor element 23 as an example.

Examples of the insulating substrate 21 include ceramic such as alumina, aluminum nitride, and silicon nitride, a highly thermal conductive particle/resin composite, a polyimide resin, a polymaleimide resin, and the like.

Examples of the metal that constitutes the first electrode 22, the second electrode 24, and the third electrode 26 include copper, nickel, silver, gold, palladium, platinum, lead, tin, cobalt, and the like. The metals can be used alone or in combination of two or more kinds thereof. In addition, the electrodes may include an alloy, which contains the metals, on a surface that is in contact with the sintered body 1 of the copper paste for joining Examples of the metal that can be used in the alloy include zinc, manganese, aluminum, beryllium, titanium, chromium, iron, molybdenum, and the like other than the above-described metals.

Examples of the metal interconnection include a metal frame having a shape such as a strip shape, a plate shape, a cubic shape, a cylindrical shape, an L-shape, and a ⊃-shape, and a Λ-shape, and the like. Examples of a material of the metal interconnection include silver, copper, iron, aluminum, molybdenum, tungsten, tantalum, niobium, or an alloy thereof. A surface of the metal interconnection may be coated with nickel, copper, gold, silver, and the like through plating, sputtering, and the like to obtain oxidation resistance and adhesiveness. In addition, the metal interconnection may have a width of 1 µm to 30 µm, and a thickness of 20 µm to 5 mm.

It is preferable that the block body has excellent thermal conductivity and electric conductivity, and for example, silver, copper, iron, aluminum, molybdenum, tungsten, tantalum, niobium, or an alloy thereof can be used as the block body. A surface of the block body may be coated with nickel, copper, gold, silver, and the like through plating, sputtering, and the like to obtain oxidation resistance and adhesiveness. When the block body is provided on the semiconductor element, heat dissipation is further improved. The number of the block body can be appropriately changed.

Examples of the insulator 29 include a silicone gel, a polymaleimide resin, a polyimide resin, a polyamideimide resin, and the like.

The semiconductor devices illustrated in FIGS. 4 to 6 can be used in a power module that is required to have high reliability at large capacity.

For example, the semiconductor device illustrated in FIGS. 4 to 6 can be manufactured by a method including a process of preparing an insulating substrate provided with a first electrode and a second electrode, providing copper paste for joining and a semiconductor element, and as necessary, copper paste for joining, a block body, and copper paste for joining on the first electrode in this order from the first electrode side, providing copper paste for joining on the second electrode, and disposing a metal interconnection on the copper paste for joining on the semiconductor element or the block body and on the copper paste for joining on the second electrode for crosslinkage of the copper paste for joining, and a process of sintering the copper paste for joining in a state of receiving own weight of the respective members, or the own weight of the respective members and a pressure of 0.01 MPa or less.

According to the manufacturing method, it is possible to manufacture a semiconductor device without pressurization. Accordingly, it is possible to perform joining without deforming the metal interconnection having a bridge portion, and it is possible to reduce damage for a semiconductor element even in the case of joining a member having an area smaller than that of the semiconductor element onto the semiconductor element.

Figure 7:
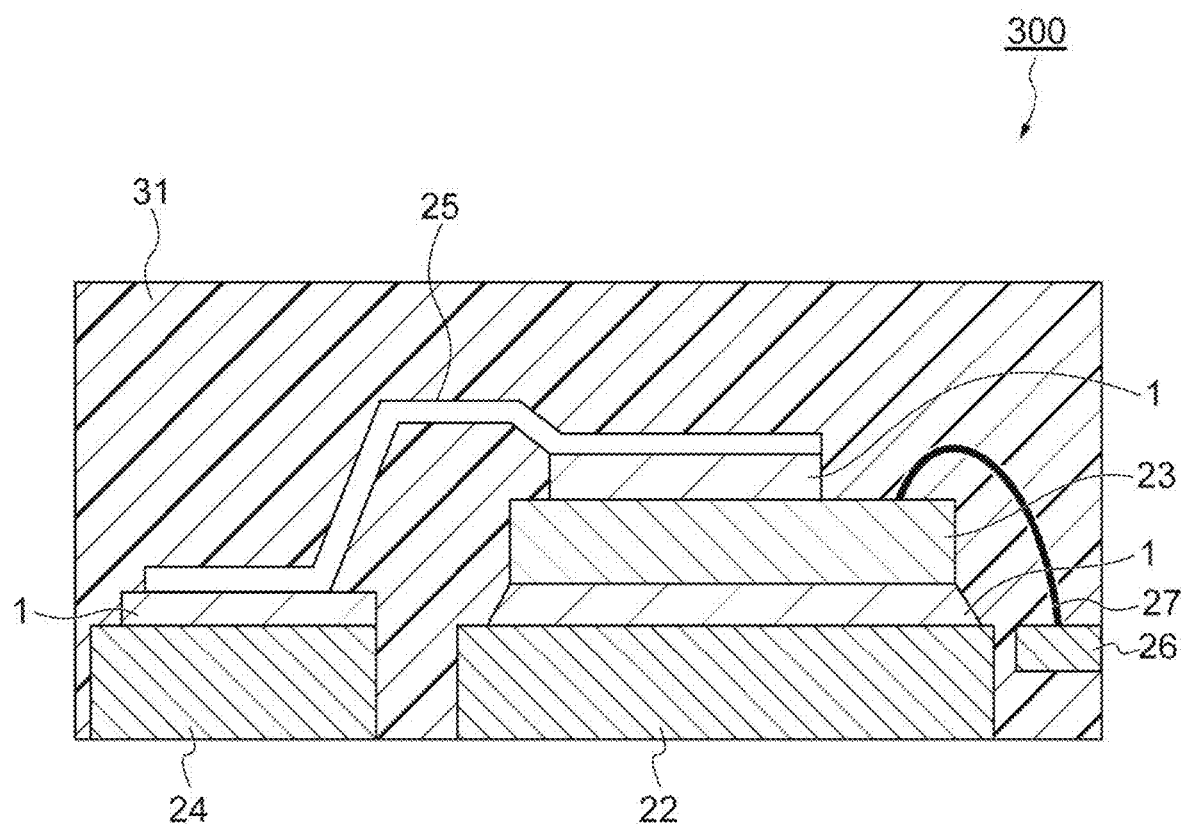
FIG. 7 is a schematic cross-sectional view illustrating an example of the semiconductor device that is manufactured by using the copper paste for joining according to this embodiment.

FIG. 7 is a schematic cross-sectional view illustrating still another example of the semiconductor device. A semiconductor device 300 illustrated in FIG. 7 includes a first electrode 22, a semiconductor element 23 that is joined onto the first electrode 22 by the sintered body 1 of the copper paste for joining, and a metal interconnection 25 that electrically connects the semiconductor element 23 and a second electrode 24. Between the metal interconnection 25 and the semiconductor element 23, and between the metal interconnection 25 and the second electrode 24 are joined by the sintered body 1 of the copper paste for joining. In addition, the semiconductor element 23 is connected to the third electrode 26 through a wire 27. In the semiconductor device 300, the above-described structure body is sealed with a sealing material 31. The semiconductor device 300 includes one piece of the semiconductor element 23 on the first electrode 22, but two or more pieces of the semiconductor elements 23 may be provided. In this case, a plurality of the semiconductor elements 23 can be respectively joined to the metal interconnection 25 by the sintered body 1 of the copper paste for joining.

Figure 8:
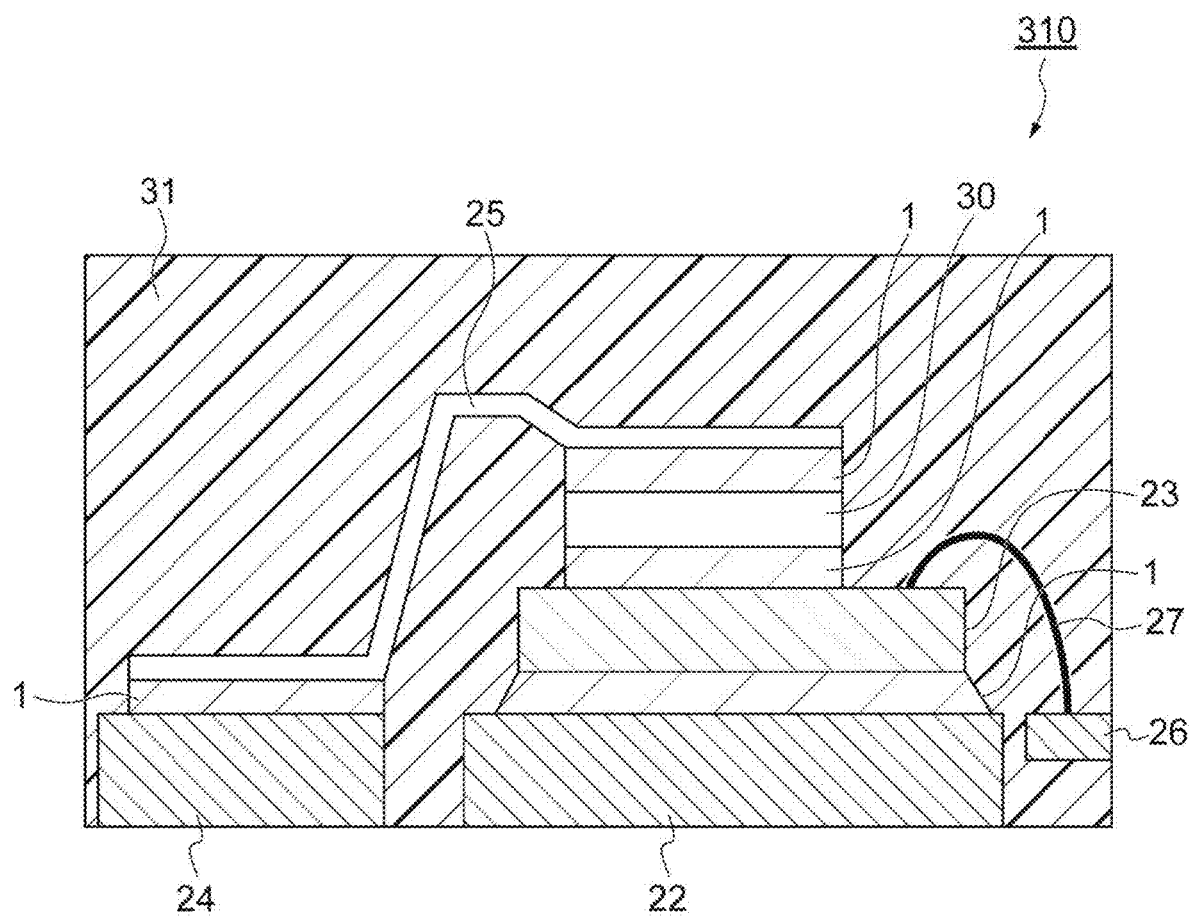
FIG. 8 is a schematic cross-sectional view illustrating an example of the semiconductor device that is manufactured by using the copper paste for joining according to this embodiment.

FIG. 8 is a schematic cross-sectional view illustrating still another example of the semiconductor device. A semiconductor device 310 illustrated in FIG. 8 has the same configuration as in the semiconductor device 300 illustrated in FIG. 7 except that a block body 30 is provided between the semiconductor element 23 and the metal interconnection 25, and between the semiconductor element 23 and the block body 30, and between the block body 30 and the metal interconnection 25 are respectively joined by the sintered body 1 of the copper paste for joining. Furthermore, a position of the block body 30 can be appropriately changed, and may be provided between the first electrode 22 and the semiconductor element 23 as an example.

Figure 9:
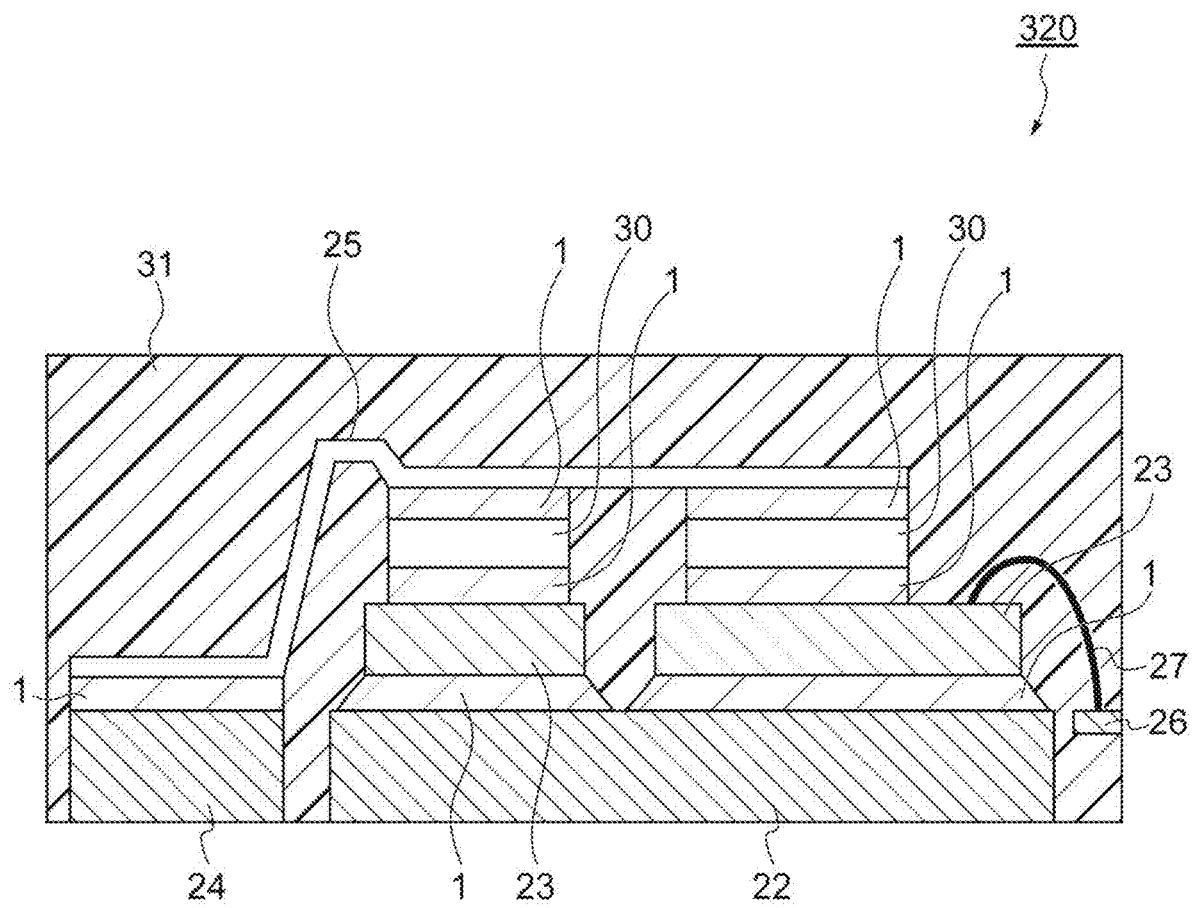
FIG. 9 is a schematic cross-sectional view illustrating an example of the semiconductor device that is manufactured by using the copper paste for joining according to this embodiment.

FIG. 9 is a schematic cross-sectional view illustrating still another example of the semiconductor device. A semiconductor device 320 illustrated in FIG. 9 has the same configuration as in the semiconductor device 310 illustrated in FIG. 8 except that the sintered body 1 of the copper paste for joining, which is parallel to the semiconductor element 23 and the block body 30, is further provided over the first electrode 22 to respectively join the first electrode 22, the semiconductor element 23, and the block body 30. The semiconductor device 320 includes two pieces of the semiconductor elements on the first electrode 22, but three or more pieces of the semiconductor elements may be provided. Even in this case, the three or more semiconductor elements 23 can be respectively joined to the metal interconnection 25 by the sintered body 1 of the copper paste for joining through the block body 30. Furthermore, a position of the block body 30 can be appropriately changed, and may be provided between the first electrode 22 and the semiconductor element 23 as an example.

The first electrode 22 and the second electrode 24 which are illustrated in FIGS. 7 to 9 may be a lead frame, a copper plate, a copper and molybdenum sintered body.

Examples of the sealing material 31 include heat-resistant solid sealing material, a highly thermal conductive composite, and the like.

The sintered body 1 of the copper paste for joining can be similar to the sundered body 1 described in the semiconductor devices 200 to 220.

When employing a lead frame and the like as the first electrode and the second electrode, the semiconductor device of the embodiment in FIGS. 7 to 9 can be used in a small-sized power module. The semiconductor devices can be manufactured in the same manner as in the above-described method for manufacturing the semiconductor device.

In addition, description will be given of still another example of the semiconductor device having a structure in which a block body is joined onto a semiconductor element.

As the semiconductor device, the following semiconductor device can be exemplified. Specifically, the semiconductor device includes a first thermal conduction member, a second thermal conduction member, and a semiconductor element that is disposed between the first thermal conduction member and the second thermal conduction member. A sintered body of the copper paste for joining is provided at least one side between the first thermal conduction member and the semiconductor element, and between the semiconductor element and the second thermal conduction member.

Figure 10:
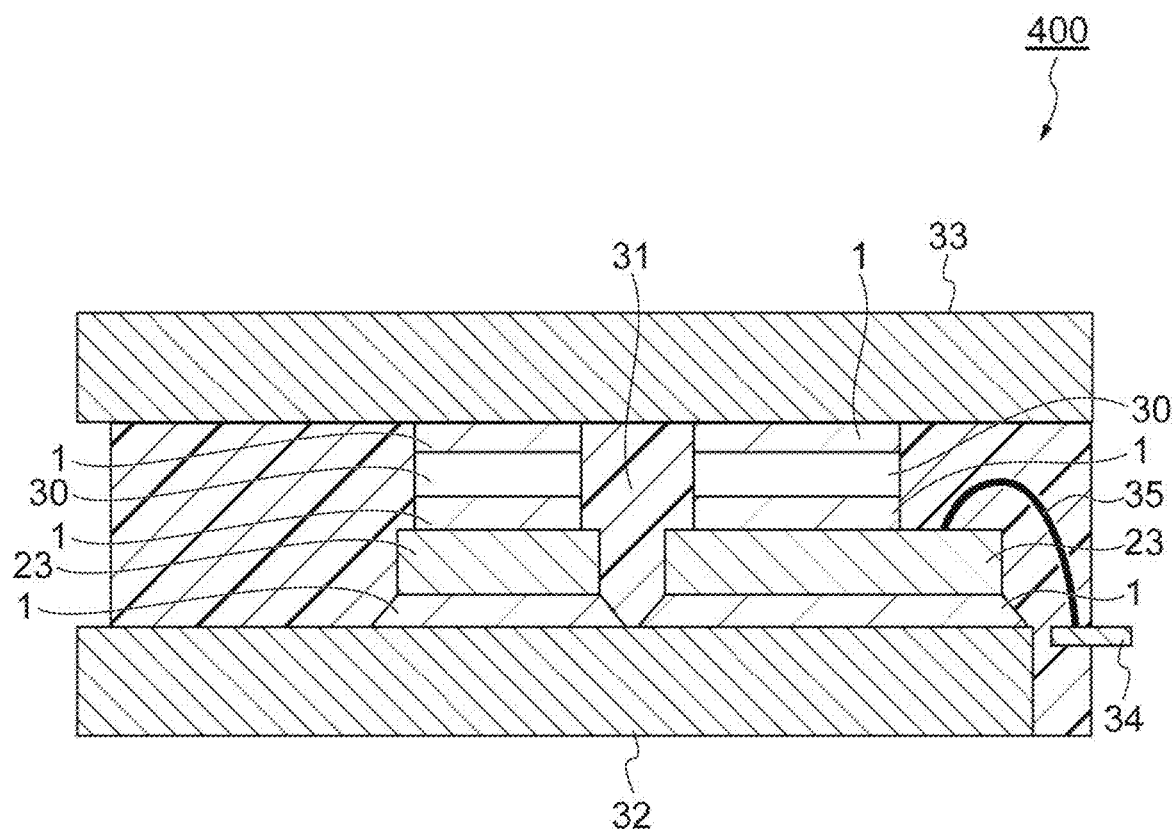
FIG. 10 is a schematic cross-sectional view illustrating an example of the semiconductor device that is manufactured by using the copper paste for joining according to this embodiment.

FIG. 10 is a schematic cross-sectional view illustrating one example of this embodiment. A semiconductor device 400 illustrated in FIG. 10 includes a first thermal conduction member 32, a semiconductor element 23 that is joined onto the first thermal conduction member 32 through the sintered body 1 of the copper paste for joining, a block body 30 that is joined onto the semiconductor element 23 through the sintered body 1 of the copper paste for joining, and a second thermal conduction member 33 that is joined onto the block body 30 through the sintered body 1 of the copper paste for joining. The semiconductor element 23 is connected to an electrode 34 through a wire 35. In the semiconductor device 400, a space between the first thermal conduction member 32 and the second thermal conduction member is sealed with a sealing material 31. The semiconductor device 400 includes two semiconductor elements. However, one or three or more semiconductor elements may be provided, and the number of the block body can be appropriately changed. Furthermore, a position of the block body 30 can be appropriately changed, and may be provided between the first electrode 22 and the semiconductor element 23 as an example.

The thermal conduction members have a function of emitting heat generated from the semiconductor element 23 to the outside, and a function as an electrode that electrically connects the semiconductor element to the outside. For example, copper, aluminum, and an alloy thereof can be used in the thermal conduction members.

The semiconductor device illustrated in FIG. 10 includes the thermal conduction member on both sides of the semiconductor element. Accordingly, the semiconductor device can have a double-sided cooling structure excellent in heat dissipation. The semiconductor device can be manufactured by a method including a process of preparing a laminated body in which copper paste for joining, a semiconductor element, copper paste for joining, a block body, copper paste for joining, and a second thermal conduction member are laminated on a first thermal conduction member in this order from the first thermal conduction member side, and sintering the copper paste for joining in a state of receiving own weight of the respective members, or the own weight of the respective members and a pressure of 0.01 MPa or less. Furthermore, in the laminated body, lamination may be performed in reverse order.

EXAMPLES

Hereinafter, the invention will be described specifically with reference to examples. However, the invention is not limited to the following examples.

<Measurement Condition>

Measurements of respective characteristics in respective Examples and Comparative Examples were performed as follows.

(1) Calculation of Major Axis (Maximum Particle Size) and Intermediate Size of Flake-Shaped Micro Copper Particles, and Calculation of Average Value of Major Axis and Average Value of Intermediate Size The flake-shaped micro copper particles were placed on a carbon tape for SEM by using a spatula, and were set as a sample for SEM. The sample for SEM was observed by a SEM apparatus (ESEM XL30 manufactured by PHILIPS or NeoScope JCM-5000 manufactured by JEOL Ltd.) at an application voltage of 10 kV. A SEM image obtained at a magnification of 2000 times was scanned by Microsoft PowerPoint (manufactured by Microsoft) (in the scanning, an image size was 17.07 cm (height)×22.75 cm (width). A straight line was drawn from an end to an end of a scale bar (in this example, a scale indicating 10 µm) on a lower side of the image, and a length of the straight line was recorded (in this example, 3.7 cm). Subsequently, a rectangle that is circumscribed to a shape derived from the flake-shaped micro copper particles was drawn. With respect to a shape derived from an arbitrary flake-shaped micro copper particle, a rectangle of 1.81 cm×1.37 cm was drawn. Here, a long side (in this example, 1.81 cm) of the rectangle was set as the major axis X of the flake-shaped micro copper particles, and a short side (in this example, 1.37 cm) of the rectangle was set as the intermediate size Y of the flake-shaped micro copper particles. From a ratio in which the scale bar of 10 µm is set to a straight line of 3.7 cm, the major axis X and the intermediate size Y were calculated as follows.

Major axis $X$=1.81 cm×10 µm/3.7 cm=4.89 µm

Intermediate size $Y$=1.37 cm×10 µm/3.7 cm=3.70 µm

The operation was repeated with respect to shapes derived from the flake-shaped micro copper particles on a screen without redundancy. However, a shape derived from a flake-shaped micro copper particle, which protrudes from a screen end and thus an image thereof is cut out, was not selected. Shapes derived from 50 or greater flake-shaped micro copper particles were measured, and an average of length measurement results was calculated. As a result, the average value $X_{av}$ of the major axis and the average value $Y_{av}$ of the intermediate size in the flake-shaped micro copper particles were obtained.

(2) Observation of Cross-Sectional Morphology of Copper Paste for Joining

A stainless steel metal mask including square openings of 3 mm×3 mm in 3 rows×3 columns was placed on a copper plate (19×25×3 $mm^3$), the copper paste for joining was applied through stencil printing using a metal squeegee. A silicon chip (chip thickness: 600 µm), in which titanium and nickel were sequentially formed and a joining surface of 3×3 $mm^2$ was formed from nickel, was placed on the applied copper paste for joining, and the silicon chip was slightly pressed with a pincette. The resultant laminated body was set on a hot plate (EC HOTPLATE EC-1200N, manufactured by AS ONE Corporation), and was dried in the air under conditions 100° C. and 30 minutes. According to this, a bonded object in which the copper plate and the silicon chip were weakly bonded by the dry copper paste for joining. The bonded object was fixed to the inside of a cup with a sample clip (samplklip I, manufactured by Buehler), and an epoxy casting resin (Epomount, manufactured by Refine Tec Ltd.) was poured to the periphery of the bonded object until the entirety of the bonded object was embedded, and the cup was left to stand in a vacuum desiccator, and a pressure was reduced for 1 minute for defoaming. Then, the bonded object that was defoamed was left to stand at room temperature for 10 hours to cure the epoxy casting resin, thereby preparing a sample. The sample was cut in the vicinity of the silicon chip by using Refine Saw Eccel (manufactured by Refine Tec Ltd.). The sample was ground to the vicinity of the center of the bonded object by using water-resistant abrasive paper (Carbomac paper, manufactured by Refine Tec Ltd.)-attached polishing apparatus (Refine Polisher Hv, manufactured by Refine Tec Ltd.) to expose a cross-section. An excessive epoxy casting resin of the polished sample was ground to a size capable of being processed with an ion milling apparatus. An ion milling apparatus (IM4000, manufactured by Hitachi High-Technologies Corporation) was used in a CP processing mode, and a cross-section of the size-processed sample was processed under conditions of an argon gas flow rate of 0.07 to 0.1 $cm^3$/min and a processing time of 120 minutes. The resultant sample was set as a sample for SEM. The sample for SEM was observed with a SEM apparatus (NeoScope JCM-5000 manufactured by JEOL Ltd.) at an application voltage of 10 kV.

(3) Calculation of Minor Axis of Flake-Shaped Micro Copper Particle

The SEM image at a magnification of 5000 times, which was obtained in "(2) Observation of Cross-Sectional Morphology of Copper Paste for Joining", was scanned with Microsoft PowerPoint (manufactured by Microsoft) (in the scanning, an image size was 9.9 cm (height)×11.74 cm (width). A straight line was drawn from an end to an end of a scale bar (in this example, a scale indicating 5 μm) on a lower side of the image, and a length of the straight line was recorded (in this example, 2.5 cm). Subsequently, a rectangle that is circumscribed to a shape derived from the flake-shaped micro copper particles was drawn. With respect to a shape derived from an arbitrary flake-shaped micro copper particle, a rectangle of 1.79 cm×0.36 cm was drawn. Here, a long side (in this example, 1.79 cm) of the rectangle corresponds to the major axis X or the intermediate size Y of the flake-shaped micro copper particle. A short side (in this example, 0.36 cm) of the rectangular was set as the minor axis T of the flake-shaped micro copper particle. From a ratio in which the scale bar of 5 μm is set to a straight line of 2.5 cm, the minor axis T was calculated as follows.

Minor axis $T=0.36$ cm×5 μm/2.5 cm=0.72 μm

The operation was repeated with respect to shapes derived from the flake-shaped micro copper particles on a screen without redundancy. However, a shape derived from a flake-shaped micro copper particle, which protrudes from a screen end and thus an image thereof is cut out, was not selected. Shapes derived from 50 or greater flake-shaped micro copper particles were measured, and an average of length measurement results was calculated. As a result, the average value Tav of the minor axis of the flake-shaped micro copper particles was obtained. A ratio of major axis/intermediate size (Xav/Yav), a ratio of major axis/minor axis (Xav/Tav), and a ratio of intermediate size/minor axis (Yav/Tav) were respectively calculated by using the average value Tav of the minor axis, and the average value Xav of the major axis and the average value Yav of the intermediate size which were obtained from "(1) Calculation of Major Axis (Maximum Particle Size) and Intermediate Size of Flake-Shaped Micro Copper Particles".

(4) Calculation of Degree of Orientation Order of Copper Paste for Joining

The SEM image at a magnification of 5000 times, which was obtained in "(2) Observation of Cross-Sectional Morphology of Copper Paste for Joining", was scanned with ImageJ (manufactured by National Institutes of Health). As the SEM image, an image in which an interface between the silicon or the silicon chip and the copper paste for joining was captured was used. A [T] key was pressed to display ROI manage window, and a check box of Show All was checked. Straight Line was selected from a main window. From an end to an end of a cross-section of the flake-shaped micro copper particle on the image was clicked and dragged to draw a line, and the [T] key was pressed to for registration in the ROI Manager window. The operation was repeated with respect to shapes derived from the flake-shaped micro copper particles on a screen without redundancy. However, a shape derived from a flake-shaped micro copper particle, which protrudes from a screen end and thus an image thereof is cut out, was not selected. Next, a measure button in the ROI Manager window was pressed. A measured angle is displayed in Results window, and thus a file was saved through an operation of [File]→+[Save As]. In a case where an interface between the substrate or the silicon chip, and the copper paste for joining deviated from an horizontal direction with respect to the image, the angle was measured in the same manner. A file of saved results was scanned in Microsoft Excel. In a case where the interface of the substrate or the silicon chip, and the copper paste for joining deviated from a horizontal direction with respect to the image, an angle of the joining interface was subtracted from each piece of angle that was measured. $\cos^2\theta$ was obtained for each piece of angle data θ, and an average value $<\cos^2\theta>$ was calculated, and the average value was substituted for $S=\frac{1}{2}\times(3<\cos^2\theta>-1)$ to calculate the degree of orientation order S.

(5) Measurement of Die Shear Strength

A stainless steel metal mask, which has a thickness of 70 μm and include square openings of 3 mm×3 mm in 3 rows×3 columns, was placed on a copper plate (19×25×3 mm$^3$), the copper paste for joining was applied through stencil printing using a metal squeegee. A silicon chip (chip thickness: 600 μm), in which titanium and nickel were sequentially formed and a joining surface of 3×3 mm$^2$ was formed from nickel, was placed on the applied copper paste for joining, and the silicon chip was slightly pressed with a pincette. The resultant laminated body was set in a tube furnace (manufactured by AVC Co., Ltd), and an argon gas was allowed to flow at a flow rate of 1 L/min to substitute the air with the argon gas. Then, the laminated body was sintered under conditions of temperature rising for 10 minutes, 350° C., and 10 minutes while allowing a hydrogen gas to flow at a flow rate of 300 mL/min, thereby obtaining a joined body in which the copper plate and the silicon chip were joined with the copper sintered body. Then, the flow rate of the argon gas was changed to 0.3 L/min, and cooling was performed. Then, the joined body, which was cooled down to 50° C. or lower was taken out into the air.

The joining strength of the joined body was evaluated by the die shear strength. The die shear strength was measured as follows. The silicon chip was pressed in a horizontal direction by using full-universal type bond glue tester (4000 series, manufactured by DAGE corporation) attached with 1 kN load cell at a measurement speed of 500 μm/s and a measurement height of 100 μm. An average value of values obtained by measuring eight joined bodies was set as the die shear strength.

(6) Density of Sintered Body

An opening of 15×15 mm$^2$ was formed in a Teflon (registered trademark) plate having a thickness of 1 mm. The Teflon (registered trademark) plate was placed on a glass plate, and the opening was filled with copper paste for joining, and copper paste overflowing from the opening was removed by a metal squeeze. The Teflon (registered trademark) plate was detached from the glass plate, and was set in a tube furnace. The Teflon plate was heated to 150° C. while allowing an argon gas to flow at a flow rate of 0.3 L/min, and was retained for 1 hour to remove the dispersion medium. In this state, the gas was changed into a hydrogen gas (300 mL/min), a temperature was raised to 350° C., and a sintering was performed for 60 minutes, thereby obtaining a sintered body. Then, the flow rate of the argon gas was changed to 0.3 L/min and cooling was performed. Then, the sintered body, which was cooled to 50° C. or lower, was taken out into the air. A plate-shaped sintered body was peeled off from the glass plate, and was polished with sand paper (No. 800) to obtain a plate-shaped sample in which a surface having a size of 10×10 mm$^2$ was flat. The dimensions of a length, a width, and a thickness of the plate-shaped sample were measured, and a weight of the plate-shaped sample was measured. A density of the plate-shaped sample was calculated from these values.

(7) Observation of Cross-Sectional Morphology of Joined Body

A joined body was manufactured by the method described in "(5) Measurement of Die Shear Strength". The manufactured joined body was fixed to the inside of a cup with a sample clip (samplklip I, manufactured by Buehler), an epoxy casting resin (Epomount, manufactured by Refine Tec Ltd.) was poured to the periphery of the joined body until the entirety of the joined body was embedded, and the cup was left to stand in a vacuum desiccator, and a pressure was reduced for 1 minute for defoaming. Then, the joined body was left to stand at room temperature for 10 hours to cure the epoxy casting resin, thereby preparing a sample. The sample was cut in the vicinity of the silicon chip by using Refine Saw Eccel (manufactured by Refine Tec Ltd.). The sample was ground to the vicinity of the center of the joined body by using water-resistant abrasive paper (Carbomac Paper, manufactured by Refine Tec Ltd.)-attached polishing apparatus (Refine Polisher Hv, manufactured by Refine Tec Ltd.) to expose a cross-section. An excessive epoxy casting resin of the polished sample was ground to a size capable of being processed with an ion milling apparatus. An ion milling apparatus (IM4000, manufactured by Hitachi High-Technologies Corporation) was used in a CP processing mode, and a cross-section of the size-processed sample was processed under conditions of an argon gas flow rate of 0.07 to 0.1 $cm^3$/min and a processing time of 120 minutes. The resultant sample was set as a sample for SEM. A cross-section of a copper sintered body in the SEM sample for SEM was observed with a SEM apparatus (NeoScope JCM-5000 manufactured by JEOL Ltd.) at an application voltage of 10 kV.

(8) Calculation of Degree of Orientation Order of Sintered Body

The SEM image at a magnification of 5000 times, which was obtained in "(7) Observation of Cross-Sectional Morphology of joined Body" was scanned with ImageJ (manufactured by National Institutes of Health). As the SEM image, an image in which an interface between the substrate or the silicon chip and the copper paste for joining was captured was used. The degree of orientation order S of the joined body was calculated in the same procedure as in the "(4) Calculation of Degree of Orientation Order of Copper Paste for Joining".

(9) Thermal Conductivity

The plate-shaped sample manufactured in "(6) Density of Sintered Body" was used, and thermal diffusivity thereof was measured by a laser flash method (LFA467, manufactured by Netch. Co. Ltd). The thermal conductivity [W/(m·k)] of the sintered body at 25° C. was calculated by the product of the thermal diffusivity, specific heat capacity obtained by a differential scanning calorimeter (DSC8500, manufactured by PerkinElmer Co., Ltd.), and the density obtained in "(6) Density of Sintered Body".

(10) Temperature Cycle Connection Reliability Test

A joined body in which a copper plate (19×25×3 $mm^3$) and a silicon chip (chip thickness: 600 μm) of which a joining surface of 3×3 $mm^2$ was formed from nickel were joined by the copper sintered body was obtained in the same manner as in "(5) Measurement of Die Shear Strength". A silicone resin (SE1880, manufactured by Dow Corning Toray Co., Ltd.) was coated on the joined body by using a syringe so as to cover the silicon chip, and was defoamed in a desiccator under a reduced pressure for 3 minutes. After defoaming, curing was performed in a hot-wind circulation oven set to 70° C. for 30 minutes and a hot-wind circulation oven set to 150° C. for 60 minutes, thereby obtaining a test specimen for temperature cycle. The test specimen for temperature cycle was set in a temperature cycle tester (TSA-72SE-W, manufactured by ESPEC CORP.) to perform a temperature cycle connection reliability test under conditions in which low-temperature side: −40° C., high-temperature side: 200° C., each stage: 15 minutes, defrosting cycle: automatic, and the number of cycles: 300 cycles. An SAT image of a joining state at an interface between the copper sintered body and an adherend before and after the temperature cycle connection reliability test was obtained by using an ultrasonic flaw detection device (INSIGHT Insight-300), and investigation was made as to whether or not peeling-off occurred. In a case where 20 area % of a joined portion was peeled off, determination was made as failure (x).

Example 1

0.5 g of α-terpineol (manufactured by Wako Pure Chemical Industries, Ltd.) and 0.5 g of isobornyl cyclohexanol (MTPH, manufactured by Nippon Terpene Chemicals, Inc.) as a dispersion medium, and 7 g of HT-14 (manufactured by MITSUI MINING & SMELTING CO., LTD.) as sub-micro copper particles were mixed in a plastic bottle, and the mixed solution was treated by an ultrasonic homogenizer (US-600, manufactured by Nippon Seiki Co., Ltd.) at 19.6 kHz and 600 W for 1 minute, thereby obtaining an dispersed solution. 3 g of MA-C025 (manufactured by MITSUI MINING & SMELTING CO., LTD.) as flake-shaped micro copper particles was added to the dispersed solution, and was mixed with a spatula until a dry powder disappeared. The plastic bottle was hermetically sealed, and was stirred by a rotation and revolution type stirrer (Planetary Vacuum Mixer ARV-310, manufactured by THINKY CORPORATION) at 2000 rpm for 2 minutes, and was stirred under a reduced pressure at 2000 rpm for 2 minutes, thereby obtaining copper paste for joining 1. Various kinds of measurement and analysis were performed by using the copper paste for joining 1.

Furthermore, in the sub-micro copper particles and the flake-shaped micro copper particles which were used as described above, the amount of the flake-shaped micro copper particles having a maximum particle size of 1 μm to 20 μm and an aspect ratio of 4 or greater, and the amount of the micro copper particles having a maximum particle size of 1 μm to 20 μm and an aspect ratio of less than 2 were converted from a particle size distribution obtained through measurement with respect to 50 or greater particles. A content ratio of the micro copper particles having a maximum particle size of 1 μm to 20 μm and an aspect ratio of less than 2 on the basis of the total amount of the flake-shaped micro copper particles having a maximum particle size of 1 μm to 20 μm and an aspect ratio of 4 or greater was calculated on the basis of the converted values.

Example 2

Copper paste for joining 2 was obtained by the same method as in Example 1 except that 3L3 (manufactured by FUKUDA METAL FOIL & POWDER CO., LTD.) was used as the flake-shaped micro copper particles. Various kinds of measurement and analysis were performed by using the copper paste for joining 2.

Example 3

Copper paste for joining 3 was obtained by the same method as in Example 1 except that 1110F (manufactured by MITSUI MINING & SMELTING CO., LTD.) was used as the flake-shaped micro copper particles. Various kinds of measurement and analysis were performed by using the copper paste for joining 3.

Example 4

Copper paste for joining 4 was obtained by the same method as in Example 1 except that TN-Cu100 (manufactured by TAIYO NIPPON SANSO CORPORATION) was used as the sub-micro copper particles. Various kinds of measurement and analysis were performed by using the copper paste for joining 4.

Example 5

Copper paste for joining 5 was obtained by the same method as in Example 1 except that CH-0200 (manufactured by MITSUI MINING & SMELTING CO., LTD.) was used as the sub-micro copper particles. Various kinds of measurement and analysis were performed by using the copper paste for joining 5.

Example 6

Copper paste for joining 6 was obtained by the same method as in Example 1 except that CT-500 (manufactured by MITSUI MINING & SMELTING CO., LTD.) was used as copper particles. Various kinds of measurement and analysis were performed by using the copper paste for joining 6.

Example 7

Copper paste for joining 7 was obtained by the same method as in Example 1 except that silver particles LM1 (manufactured by TOKUSEN KOGYO Co., ltd) were used as an additive. Various kinds of measurement and analysis were performed by using the copper paste for joining 7.

Example 8

Copper paste for joining 8 was obtained by the same method as in Example 1 except that nickel particles Ni-HWQ (manufactured by FUKUDA METAL FOIL & POWDER CO., LTD.) were used as an additive. Various kinds of measurement and analysis were performed by using the copper paste for joining 8.

Example 9

Copper paste for joining 9 was obtained by the same method as in Example 1 except that spherical copper particles 1300Y (manufactured by MITSUI MINING & SMELTING CO., LTD.) were used as the micro copper particles having a maximum particle size of 1 µm to 20 µm and an aspect ratio of less than 2. Various kinds of measurement and analysis were performed by using the copper paste for joining 9.

Comparative Example 1

Copper paste for joining 10 was obtained by the same method as in Example 1 except that the flake-shaped micro copper particles were not added. Various kinds of measurement and analysis were performed by using the copper paste for joining 10.

Comparative Example 2

Copper paste for joining 11 was obtained by the same method as in Example 1 except that spherical copper particles 1300Y (manufactured MITSUI MINING & SMELTING CO., LTD.) were used instead of the flake-shaped micro copper particles. Various kinds of measurement and analysis were performed by using the copper paste for joining 11.

Comparative Example 3

Copper paste for joining 12 was obtained by the same method as in Example 1 except that spherical copper particles 1100Y (manufactured MITSUI MINING & SMELTING CO., LTD.) were used instead of the flake-shaped micro copper particles. Various kinds of measurement and analysis were performed by using the copper paste for joining 12.

Comparative Example 4

Copper paste for joining 13 was obtained by the same method as in Example 1 except that spherical copper particles 1050Y (manufactured MITSUI MINING & SMELTING CO., LTD.) were used instead of the flake-shaped micro copper particles. Various kinds of measurement and analysis were performed by using the copper paste for joining 13.

Comparative Example 5

Copper paste for joining 14 was obtained by the same method as in Example 1 except that spherical copper particles 1020Y (manufactured MITSUI MINING & SMELTING CO., LTD.) were used instead of the flake-shaped micro copper particles. Various kinds of measurement and analysis were performed by using the copper paste for joining 14.

Compositions and test results of Examples and Comparative Examples are illustrated in Tables 1 to 3.

Shapes of the copper particles which were used in Examples and Comparative Examples are as follows.

(Sub-Micro Copper Particles)

HT-14: 50% volume-average particle size was 0.36 µm, and the amount of copper particles having a particle size of 0.12 µm to 0.8 µm was 100% by mass TN-Cu100: 50% volume-average particle size was 0.12 µm, and the amount of copper particles having a particle size of 0.12 µm to 0.8 µm was 90% by mass CH-0200: 50% volume-average particle size was 0.36 µm, and the amount of copper particles having a particle size of 0.12 µm to 0.8 µm was 100% by mass CT-500: 50% volume-average particle size was 0.72 µm, and the amount of copper particles having a particle size of 0.12 µm to 0.8 µm was 80% by mass In the sub-micro copper particles, both of the amount of the flake-shaped micro copper particles having a maximum particle size of 1 µm to 20 µm and an aspect ratio of 4 or greater, and the amount of the micro copper particles having a maximum particle size of 1 µm to 20 µm and an aspect ratio of less than 2 were 0% by mass.

(Flake-Shaped Micro Copper Particles)

MA-025: an average maximum particle size was 4.1 µm, an aspect ratio was 7.9, and the amount of copper particles having a maximum particle size of 1 µm to 20 µm was 100% by mass.

3L3: an average maximum particle size was 7.3 µm, an aspect ratio was 26, and the amount of copper particles having a maximum particle size of 1 µm to 20 µm was 100% by mass.

1110F: an average maximum particle size was 5.8 μm, an aspect ratio was 20, and the amount of copper particles having a maximum particle size of 1 μm to 20 μm was 100% by mass.

In the flake-shaped micro copper particles, the amount of the flake-shaped micro copper particles having a maximum particle size of 1 μm to 20 μm and an aspect ratio of 4 or greater was 100% by mass, and the amount of the micro copper particles having a maximum particle size of 1 μm to 20 μm and an aspect ratio of less than 2 was 0% by mass.

(Micro Copper Particles)

1300Y: an average maximum particle size was 3.3 μm, and an aspect ratio was 1.

Furthermore, the volume-average particle size was obtained by the following method.

(50% Volume-Average Particle Size)

50% volume-average particle size was measured by using a shimadzu nano particle size distribution measuring apparatus (SALD-7500 nano, manufactured by Shimadzu Corporation) and accessary software (WingSALDII-7500- for Japanese V3, manufactured by Shimadzu Corporation) in accordance with (1) to (5) to be described below.

(1) Software Setting

WingSALDII-7500- for Japanese V3.1 was activated in an accessary personal computer of the measurement apparatus, and a manual was pressed to initiate the apparatus. After termination of initialization, a retention file name was designated and "next" was clicked to set measurement conditions and particle size distribution calculation conditions as follows. Then, "next" was clicked.

(Measurement Conditions)

Detection of Diffracted/Scattered Light Average number of times (number of times of measurement): 128, the number of times of measurement: 1, measurement interval(second): 2

Measurement Light Absorption Range
Maximum value: 0.2, minimum value: 0
Blank region/measurement region
Blank measurement permissible fluctuation maximum value: 150, measurement optimal range (MAX): 45000, measurement optimal range (MIN): 15000

(Particle Size Distribution Calculation Condition)
Selection of refractive index: reference sample/pure metal/semiconductor and the like (solid value)
Material of sample: 4 Copper (copper)
Selection of refractive index: 1.18 to 2.21 "lateral/backward sensors are evaluated" was checked (2) Blank Measurement Measurement was performed by attaching a shimadzu nano particle size distribution measuring apparatus (SALD-7500 nano, manufactured by Shimadzu Corporation) to SALD-7500 nano. α-terpineol (manufactured by Wako Pure Chemical Industries, Ltd.) was added dropwise into a funnel-attached batch cell (part number S347-61030-41, manufactured by Shimadzu Corporation, hereinafter, referred to as "batch cell"), which is an accessary of SALD-BC75, with a syringe in such a manner that the α-terpineol exists between two marked lines of the batch cell. "Diagnosis" and "adjustment" were selected on a screen of WingSALDII-7500- for Japanese V3 to confirm that a positional sensor output was in an apparatus-permissible range. "Cancel (removal)" was clicked to return to the original screen, and blank measurement was selected to perform measurement.

(3) Preparation Measurement Solution 2 mg of copper paste for joining to be measured was placed on a stirring lever of a batch cell holder (part number S347-62301, manufactured by Shimadzu Corporation) which is an accessary of SALD-BC75, and was set in a funnel-attached batch cell. Next, "stirrer" was selected on the screen of WingSALDII-7500- for Japanese V3 to perform stirring for 15 minutes.

(4) Measurement

After stirring, "measurement" was selected on the screen of WingSALDII-7500- for Japanese V3 to perform measurement. Operations of (1) to (4) were repeated four times to perform measurement four times.

(5) Statistics

WingSALDII-7500- for Japanese V3 was activated, and "open" was clicked to select a measured file. Measurement data was displayed on the screen of WingSALDII-7500- for Japanese V3. "Overlay drawing" was clicked to display 50.000% diameter on a lower state of the screen, and an average value of four times was set as the 50% volume-average particle size.

TABLE 1

|  |  | Example 1 | Example 2 | Example 3 | Example 4 | Example 5 |
|---|---|---|---|---|---|---|
| Copper paste for joining |  | 1 | 2 | 3 | 4 | 5 |
| Dispersion medium | Kind | α-terpineol | α-terpineol | α-terpineol | α-terpineol | α-terpineol |
|  | Parts by mass | 0.5 | 0.5 | 0.5 | 0.5 | 0.5 |
|  | Kind | MTPH | MTPH | MTPH | MTPH | MTPH |
|  | Parts by mass | 0.5 | 0.5 | 0.5 | 0.5 | 0.5 |
| Sub-micro copper particles | Kind | HT-14 | HT-14 | HT-14 | TN-Cu100 | CH-200 |
|  | Parts by mass | 7 | 7 | 7 | 7 | 7 |
| Flake-shape micro copper particles | Kind | MA-C025 | 3L3 | 1110F | MA-C025 | MA-C025 |
|  | Parts by mass | 3 | 3 | 3 | 3 | 3 |
| Micro copper particles | Kind | — | — | — | — | — |
|  | Parts by mass | 0 | 0 | 0 | 0 | 0 |
| Additive | Kind | — | — | — | — | — |
|  | Parts by mass | — | — | — | — | — |
| Material of joining surface of substrate |  | Copper | Copper | Copper | Copper | Copper |

TABLE 1-continued

|  |  | Example 1 | Example 2 | Example 3 | Example 4 | Example 5 |
|---|---|---|---|---|---|---|
| Material of joining surface of chip |  | Nickel | Nickel | Nickel | Nickel | Nickel |
| Amount of flake-shaped micro copper particles having maximum particle size of 1 μm 20 μm and aspect ratio of 4 or greater | Parts by mass | 3 | 3 | 3 | 3 | 3 |
| Amount of micro copper particles having maximum particle size of 1 μm 20 μm and aspect ratio of less than 2 | Parts by mass | 0 | 0 | 0 | 0 | 0 |
| Content ratio of micro copper particles to flake-shaped micro copper particles | % by mass | 0 | 0 | 0 | 0 | 0 |
| Shape of flake-shaped micro copper particles | Xav (Average maximum particle size) | 4.1 | 7.3 | 5.8 | 4.1 | 4.1 |
|  | Yav | 3.7 | 5 | 4.4 | 3.7 | 3.7 |
|  | Tav | 0.52 | 0.28 | 0.29 | 0.52 | 0.52 |
|  | Xav/Yav | 1.1 | 1.4 | 1.3 | 1.1 | 1.1 |
|  | Xav/Tav (Aspect ratio) | 7.9 | 26 | 20 | 7.9 | 7.9 |
|  | Yav/Tav | 7.1 | 18 | 15 | 7.1 | 7.1 |
| Degree of orientation order S | Copper paste for joining | 0.91 | 0.94 | 0.91 | 0.89 | 0.95 |
|  | Joined body | 0.90 | 0.91 | 0.89 | 0.88 | 0.93 |
| Thermal conductivity (W/(mK)) |  | 180 | 190 | 150 | 120 | 180 |
| Die shear strength (Mpa) |  | 31 | 33 | 30 | 22 | 38 |
| Temperature cycle connection reliability |  | ○ | ○ | ○ | ○ | ○ |

TABLE 2

|  |  | Example 6 | Example 7 | Example 8 | Example 9 |
|---|---|---|---|---|---|
| Copper paste for joining |  | 6 | 7 | 8 | 9 |
| Dispersion medium | Kind | α-terpineol | α-terpineol | α-terpineol | α-terpineol |
|  | Parts by mass | 0.5 | 0.5 | 0.5 | 0.5 |
|  | Kind | MTPH | MTPH | MTPH | MTPH |
|  | Parts by mass | 0.5 | 0.5 | 0.5 | 0.5 |
| Sub-micro copper particles | Kind | CT-500 | HT-14 | HT-14 | HT-14 |
|  | Parts by mass | 7 | 7 | 7 | 7 |
| Flake-shape micro copper particles | Kind | MA-C025 | MA-C025 | MA-C025 | MA-C025 |
|  | Parts by mass | 3 | 3 | 3 | 2 |
| Micro copper particles | Kind | — | — | — | 1300Y |
|  | Parts by mass | 0 | 0 | 0 | 1 |
| Additive | Kind | — | LM1 | Ni-HWQ | — |
|  | Parts by mass | — | 0.5 | 0.5 | — |
| Material of joining surface of substrate |  | Copper | Copper | Copper | Copper |
| Material of joining surface of chip |  | Nickel | Nickel | Nickel | Nickel |
| Amount of flake-shaped micro copper particles having maximum particle size of 1 μm 20 μm and aspect ratio of 4 or greater | Parts by mass | 3 | 3 | 3 | 2 |
| Amount of micro copper particles having maximum particle size of 1 μm 20 μm and aspect ratio of less than 2 | Parts by mass | 0 | 0 | 0 | 1 |
| Content ratio of micro copper particles to flake-shaped micro copper particles | % by mass | 0 | 0 | 0 | 50 |
| Shape of flake-shaped micro copper particles | Xav (Average maximum particle size) | 4.1 | 4.1 | 4.1 | 4.1 |
|  | Yav | 3.7 | 3.7 | 3.7 | 3.7 |
|  | Tav | 0.52 | 0.52 | 0.52 | 0.52 |
|  | Xav/Yav | 1.1 | 1.1 | 1.1 | 1.1 |
|  | Xav/Tav (Aspect ratio) | 7.9 | 7.9 | 7.9 | 7.9 |
|  | Yav/Tav | 7.1 | 7.1 | 7.1 | 7.1 |

TABLE 2-continued

|  |  | Example 6 | Example 7 | Example 8 | Example 9 |
|---|---|---|---|---|---|
| Degree of orientation order S | Copper paste for joining | 0.90 | 0.91 | 0.91 | 0.88 |
|  | Joined body | 0.88 | 0.90 | 0.90 | 0.88 |
| Thermal conductivity (W/(mK)) |  | 150 | 185 | 170 | 155 |
| Die shear strength (Mpa) |  | 23 | 32 | 34 | 23 |
| Temperature cycle connection reliability |  | ○ | ○ | ○ | ○ |

TABLE 3

|  |  | Comparative Example 1 | Comparative Example 2 | Comparative Example 3 | Comparative Example 4 | Comparative Example 5 |
|---|---|---|---|---|---|---|
| Copper paste for joining |  | 10 | 11 | 12 | 13 | 14 |
| Dispersion medium | Kind | α-terpineol | α-terpineol | α-terpineol | α-terpineol | α-terpineol |
|  | Parts by mass | 0.5 | 0.5 | 0.5 | 0.5 | 0.5 |
|  | Kind | MTPH | MTPH | MTPH | MTPH | MTPH |
|  | Parts by mass | 0.5 | 0.5 | 0.5 | 0.5 | 0.5 |
| Sub-micro copper particles | Kind | HT-14 | HT-14 | HT-14 | HT-14 | HT-14 |
|  | Parts by mass | 10 | 7 | 7 | 7 | 7 |
| Flake-shape micro copper particles | Kind | — | — | — | — | — |
|  | Parts by mass | — | — | — | — | — |
| Micro copper particles | Kind | — | 1300Y | 1100Y | 1050Y | 1020Y |
|  | Parts by mass | — | 3 | 3 | 3 | 3 |
| Additive | Kind | — | — | — | — | — |
|  | Parts by mass | — | — | — | — | — |
| Material of joining surface of substrate |  | Copper | Copper | Copper | Copper | Copper |
| Material of joining surface of chip |  | Nickel | Nickel | Nickel | Nickel | Nickel |
| Degree of orientation order S | Copper paste for joining | Hard to define | Hard to define | Hard to define | Hard to define | Hard to define |
|  | Joined body | Hard to define | Hard to define | Hard to define | Hard to define | Hard to define |
| Thermal conductivity (W/(mK)) |  | Hard to measure (Cracking of sintered body) | 40 | 25 | 21 | Hard to measure (Cracking of sintered body) |
| Die shear strength (Mpa) |  | 8 | 12 | <1 (Hard to join) | <1 (Hard to join) | <1 (Hard to join) |
| Temperature cycle connection reliability |  | ×(Partial peeling-off) | ×(Partial peeling-off) | ×(Hard to join) | ×(Hard to join) | ×(Hard to join) |

As can be seem from Tables 1 to 3, in the joined bodies using the copper paste for joining of Examples, particular pressurization was not performed and only own weight of the chip was applied when manufacturing the joined bodies as described in "(5) Measurement of Die Shear Strength", and thus satisfactory die shear strength, thermal conductivity, and connection reliability are provided. On the other hand, in the joined bodies using the copper paste for joining of Comparative Examples which did not contain the flake-shaped micro copper particles, in the case of not performing pressurization when manufacturing the joined bodies, it was difficult to sufficiently join a chip and a substrate.

(Observation of Cross-Sectional Morphology)

Figure 11:
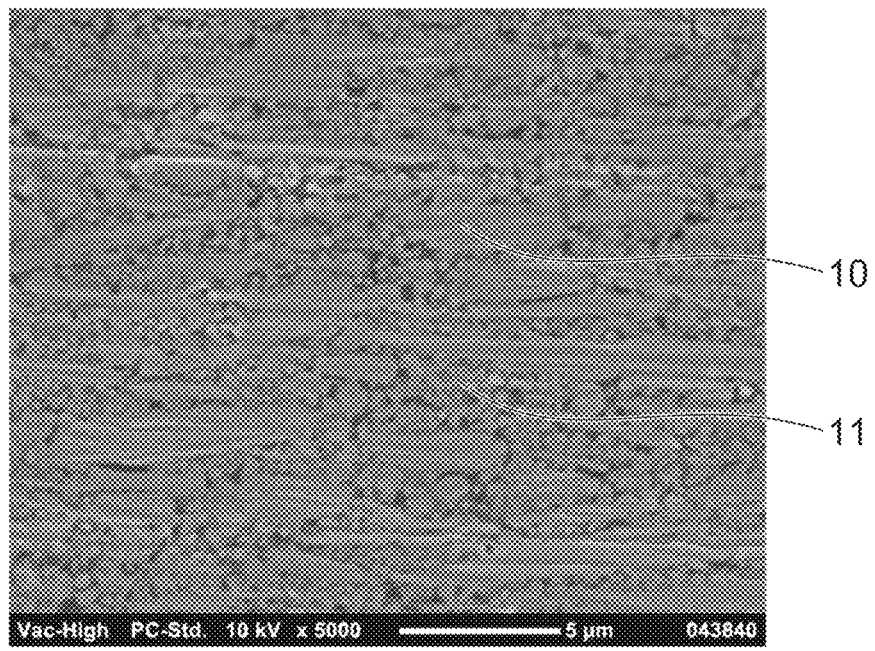
FIG. 11 is a SEM image illustrating a cross-sectional morphology of the copper paste for joining in Example 1.
Figure 12:
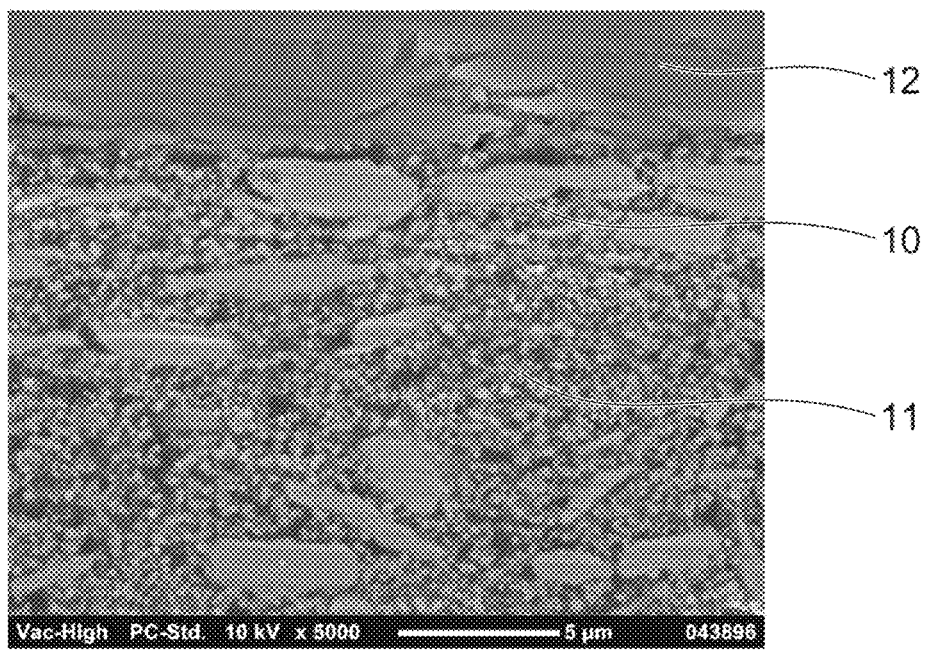
FIG. 12 is a SEM image illustrating a cross-sectional morphology of the copper paste for joining in Example 4.
Figure 13:
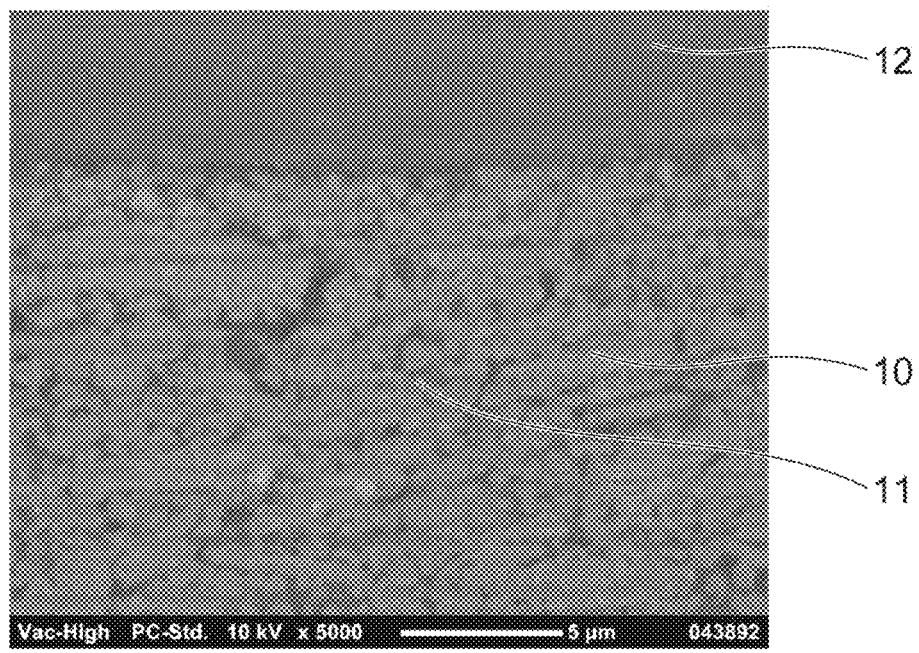
FIG. 13 is a SEM image illustrating a cross-sectional morphology of the copper paste for joining in Example 6.

FIGS. 11 to 13 are SEM images of a dry film of the copper paste for joining that was prepared by disposing the copper paste for joining of each of Examples 1, 4, and 6 between a chip 12 and a substrate, and performing a heat treatment at 100° C. for 30 minutes. In the drawings, a structure in which vacancies between flake-shaped micro cooper particles 10 are filled with a non-flake-shaped copper particles 11 (sub-micro copper particles) in the copper past for joining is shown. The copper paste for joining has a specific average maximum particle size and a specific aspect ratio, and thus the flake-shaped micro copper particles 10 are likely to be oriented in approximately parallel to an interface with the chip 12 or the substrate due to a shear force when the copper paste for joining is printed and applied onto the substrate, or a minute pressure when the chip 12 is mounted on the copper paste for joining.

FIGS. 15 to 18 are SEM images of a joined body that was prepared by disposing the copper paste for joining of each of Examples 1, 2, 4, and 6 between the chip 12 and a substrate 15, and by performing sintering at 350° C. for 25 minutes. From the drawings, it can be seen that even after sintering, a state of the copper paste for joining before sintering is reflected. That is, vacancies of a shape 13 derived from the flake-shaped micro copper particles are filled with a shape 14 derived from non-flake-shaped copper particles, and thus the shape 13 derived from the flake-shaped micro copper particles is oriented in approximately parallel to a joining surface of the chip 12 or the substrate 15. The joined bodies prepared by using the copper paste for joining of the invention can have a copper sintered body having more excellent connection reliability in comparison to a sintered body formed from joining copper paste including only non-flake-shaped copper particles (for example, spherical copper particles) due to a reinforcing effect in which the above-described orientation structure is densely connected.

Figure 14:
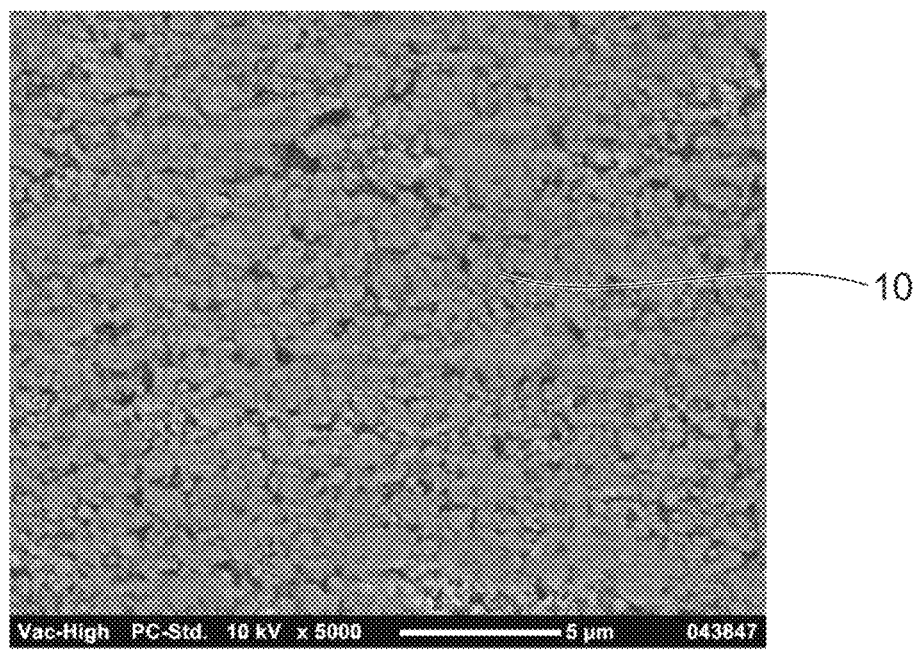
FIG. 14 is a SEM image illustrating a cross-sectional morphology of the copper paste for joining in Comparative Example 4.
Figure 15:
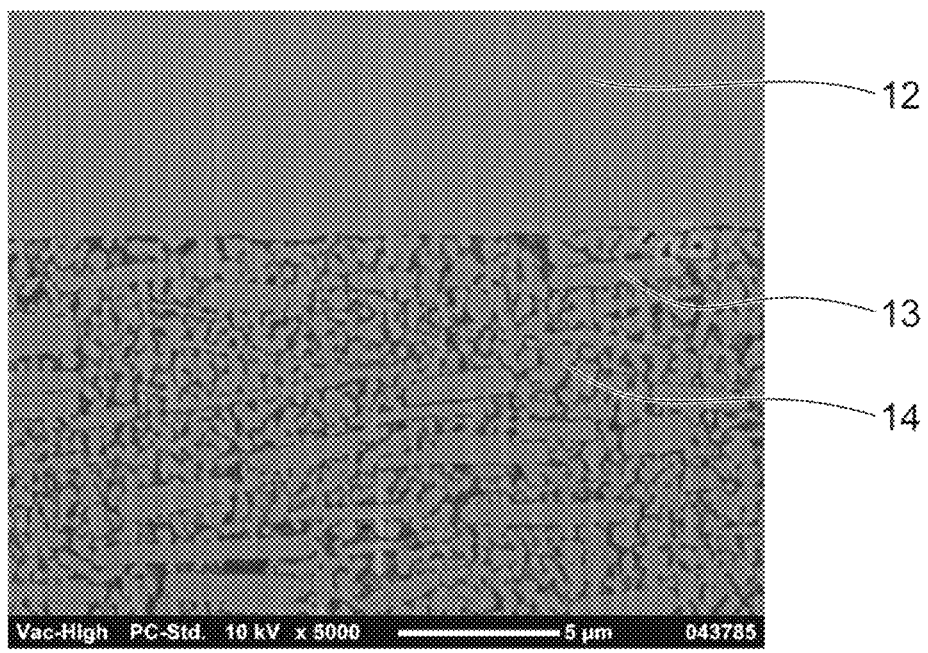
FIG. 15 is a SEM image illustrating a cross-section of a sintered body in a joined body using the copper paste for joining in Example 1.
Figure 16:
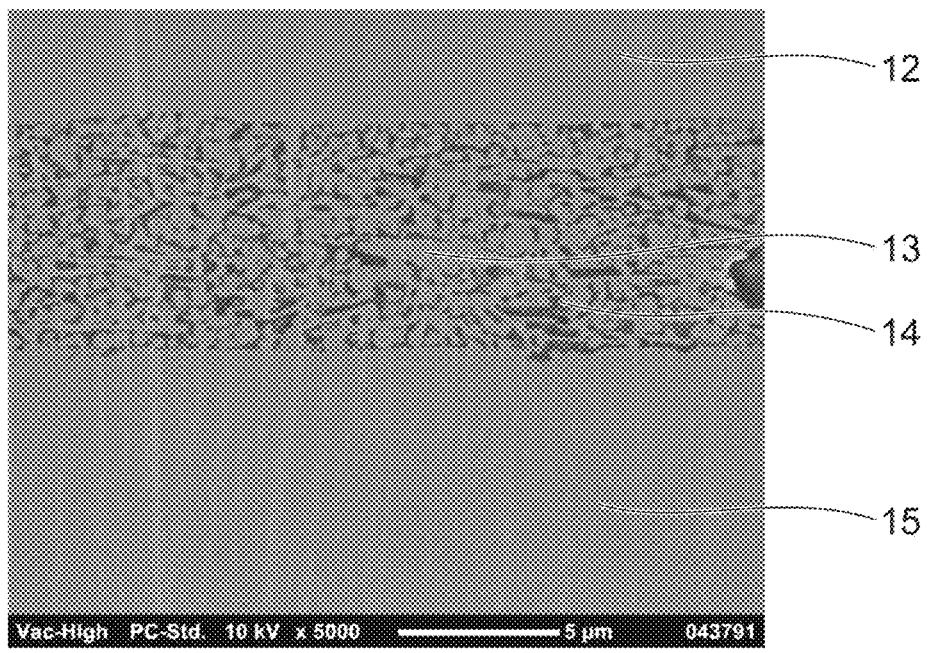
FIG. 16 is a SEM image illustrating a cross-section of a sintered body in a joined body using the copper paste for joining in Example 2.
Figure 17:
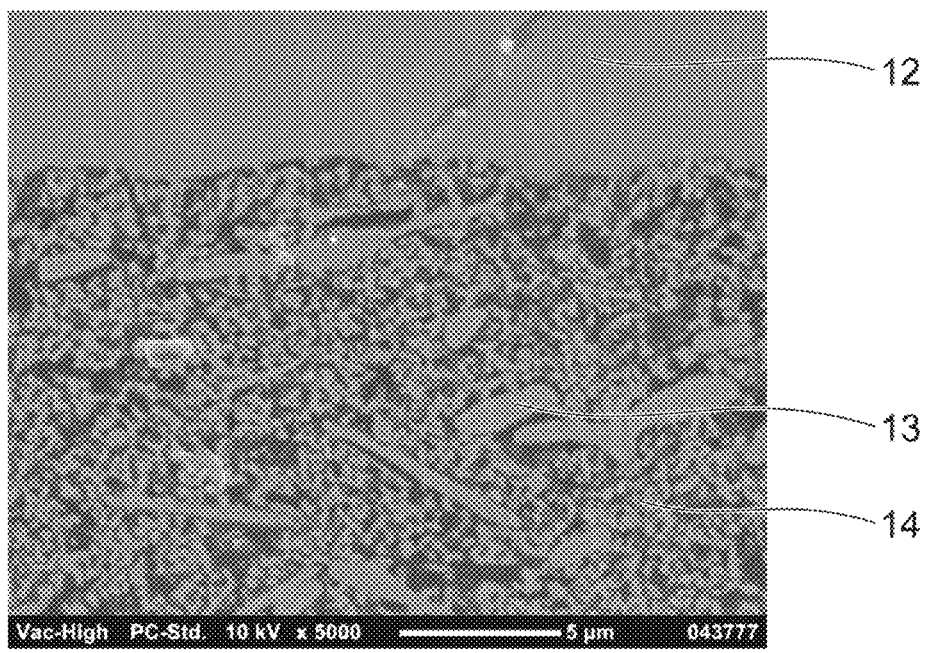
FIG. 17 is a SEM image illustrating a cross-section of a sintered body in a joined body using the copper paste for joining in Example 4.
Figure 18:
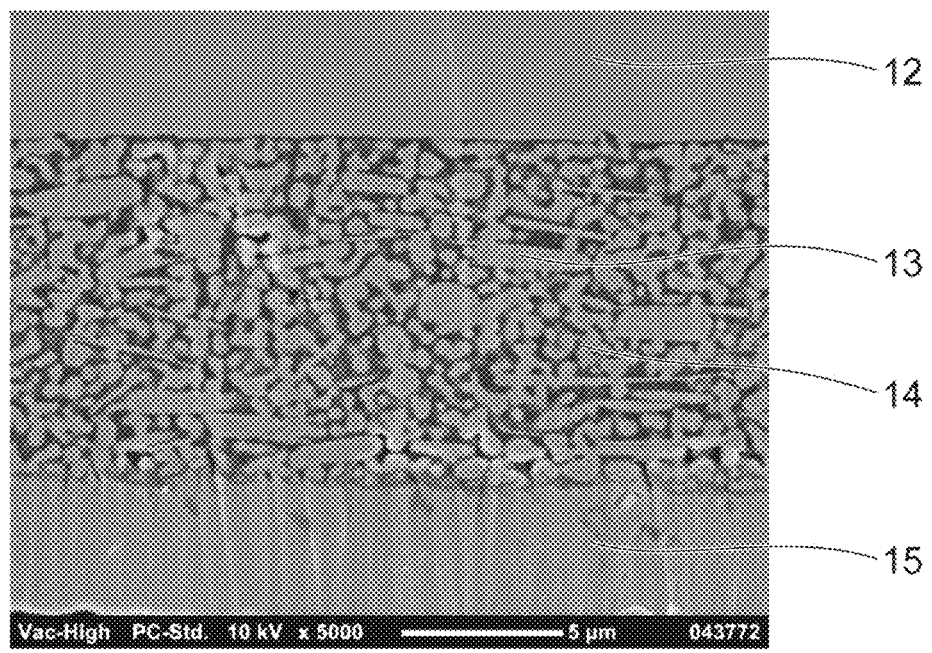
FIG. 18 is a SEM image illustrating a cross-section of a sintered body in a joined body using the copper paste for joining in Example 6.
Figure 19:
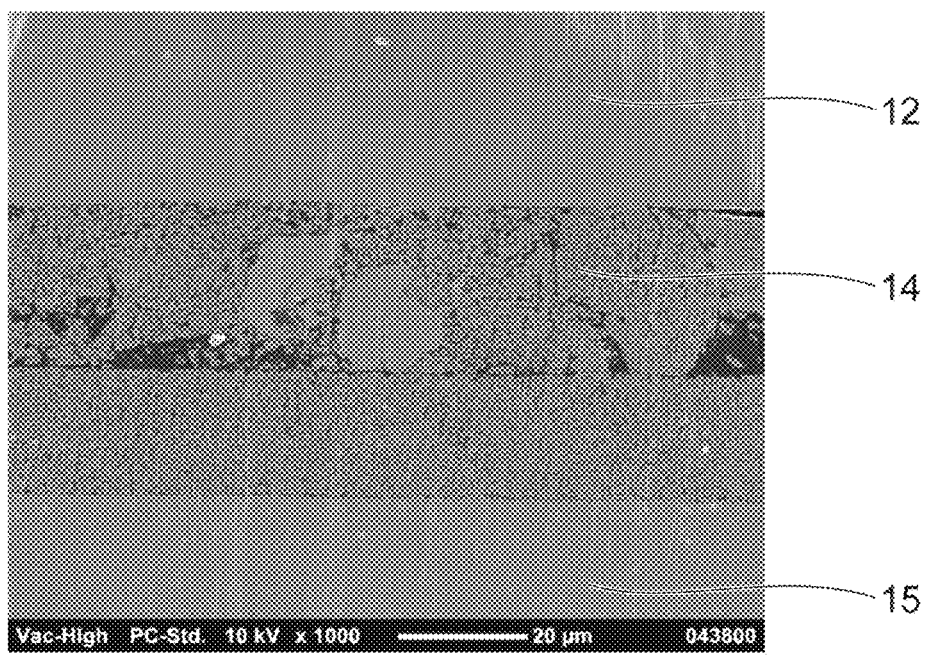
FIG. 19 is a SEM image illustrating a cross-section of a sintered body in a joined body using the copper paste for joining in Comparative Example 3.
Figure 20:
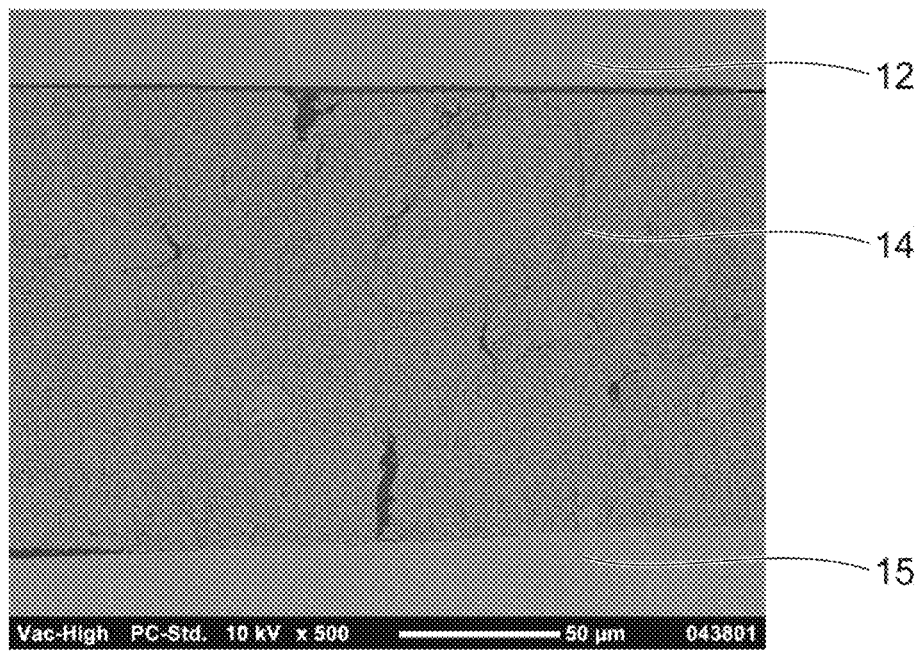
FIG. 20 is a SEM image illustrating a cross-section of a sintered body in a joined body using the copper paste for joining in Comparative Example 4.

FIG. 14 is a SEM image of a dry film of the copper paste for joining prepared by disposing the copper paste for joining of Comparative Example 4 between a chip and a substrate, and by performing a heat treatment at 100° C. for 30 minutes. The copper paste for joining of Comparative Example 4 is copper paste for joining that includes only the non-flake-shaped copper particles 11. FIGS. 19 and 20 are SEM images of a joined body prepared by disposing the copper paste for joining of each of Comparative Examples 3 and 4 between the chip 12 and the substrate 15, and by performing sintering at 350° C. for 25 minutes. In the copper paste for joining prepared by using only the non-flake-shaped copper particles, due to reasons such as the non-flake-shaped copper particles are sintered in a shape close to point contact, and it is difficult to sufficiently secure a joining area with respect to a joining surface, it is difficult to secure sufficient joining, and a result of connection reliability test after joining is not satisfactory.

From the above-described result, in an electronic device including a sintered body formed from the copper paste for joining according to the invention as a joining layer, even in a case where a thermal stress occurred due to a difference in a coefficient of thermal expansion between joined members is applied to the joining layer, it is considered that high connection reliability can be maintained. The reason for this is considered to be because propagation of cracks which occur in the sintered body of the copper paste for joining due to the thermal stress is blocked by the orientation structure derived from the flake-shaped micro copper particles, and thus connection reliability becomes excellent. In addition, the sintered body is constituted by metal copper that is connected with a metal bond. Accordingly, thermal conductivity as high as 100 W/(m·k) or greater is exhibited, and thus rapid heat dissipation is possible in mounting of an electronic device in which heat generation is great. In addition, according to the copper paste for joining of the invention, strong joining is attained with a metal bond without pressurization. Accordingly, die shear strength in which a material of the joining surface exhibits joining strength with respect to copper, nickel, silver, and gold may be set to 20 MPa or greater. As described above, the copper paste for joining according to the invention has properties which are very effective for joining of an electronic device such as a power device, logics, and an amplifier in which heat generation is great. Accordingly, in the case of applying the copper paste for joining according to the invention, relatively high input power can be permitted, and an operation at a high operation temperature is possible.

REFERENCE SIGNS LIST

1: Sintered body of copper paste for joining, 2: First member, 3: Second member, 5a, 5b: Lead frame, 6: Wire, 7: Mold resin, 8: Semiconductor element, 9: Flake-shaped micro copper particles, 10: Flake-shaped micro copper particles (not sintered), 11: Non-flake-shaped micro copper particles (not sintered), 12: Chip (material: Si, Copper), 13: Shape derived from flake-shaped micro copper particles (after sintering), 14: Shape derived from non-flake-shaped micro copper particles (after sintering), 15: Substrate (copper), 100: Joined body, 110: Semiconductor device, 21: Insulating substrate, 22: First electrode, 23: Semiconductor element, 24: Second electrode, 25: Metal interconnection, 26: Third electrode, 27: Wire, 28: Copper plate, 29: Insulator, 30: Block body, 31: Sealing material, 32: First thermal conduction member, 33: Second thermal conduction member, 34: Electrode, 35: Wire, 200: Semiconductor device, 210: Semiconductor device, 220: Semiconductor device, 300: Semiconductor device, 310: Semiconductor device, 320: Semiconductor device, 400: Semiconductor device.

The invention claimed is:

1. Copper paste for joining, comprising:
   metal particles; and
   a dispersion medium,
   wherein the metal particles include:
      sub-micro copper particles having a volume-average particle size of 0.3 μm to 0.8 μm, and
      flake-shaped micro copper particles having a maximum particle size of 1 μm to 20 μm and an aspect ratio of 4 or greater,
   an amount in the metal particles of micro copper particles having a maximum particle size of 1 μm to 20 μm and an aspect ratio of less than 2 is 50% by mass or less on the basis of a total amount of the flake-shaped micro copper particles,
   a maximum particle size of any particles in the copper paste is 20 μm,
   the amount of the sub-micro copper particles contained is 20% by mass to 90% by mass on the basis of a sum of a mass of the sub-micro copper particles and a mass of the flake-shaped micro copper particles, and
   the amount of the flake-shaped micro copper particles contained is 1% by mass to 90% by mass on the basis of a total mass of the metal particles.

2. The copper paste for joining according to claim 1, wherein the copper paste for joining is used without pressurization.

3. The copper paste for joining according to claim 1, wherein the metal particles include at least one kind of metal particles selected from the group consisting of nickel, silver, gold, palladium, and platinum.

4. The copper paste for joining according to claim 2, wherein the metal particles include at least one kind of metal particles selected from the group consisting of nickel, silver, gold, palladium, and platinum.

5. The copper paste for joining according to claim 1, wherein the metal particles include sub-micro copper particles having a volume-average particle size of 0.3 μm to 0.45 μm.

6. The copper paste for joining according to claim 1, wherein the maximum particle size of any particles in the copper paste is 10 μm.

7. A method for manufacturing a joined body, comprising:
   a process of preparing a laminated body in which a first member, and the copper paste for joining according to claim 1 and a second member that are disposed on a side whereon a weight of the first member acts, are laminated in this order; and sintering the copper paste for joining in a state of receiving only the weight of the first member, or the weight of the first member and a pressure of 0.01 MPa or lower.

8. A method for manufacturing a semiconductor device, comprising:
   a process of preparing a laminated body in which a first member, and the copper paste for joining according to claim 1 and a second member that are disposed on a side whereon a weight of the first member acts, are laminated in this order; and sintering the copper paste for joining in a state of receiving only the weight of the first member, or the weight of the first member and a pressure of 0.01 MPa or lower,
   wherein at least one of the first member and the second member is a semiconductor element.

* * * * *